(12) United States Patent
Saitoh et al.

(10) Patent No.: US 11,916,038 B2
(45) Date of Patent: Feb. 27, 2024

(54) CHEMICAL BONDING METHOD, PACKAGE-TYPE ELECTRONIC COMPONENT, AND HYBRID BONDING METHOD FOR ELECTRONIC DEVICE

(71) Applicants: CANON ANELVA CORPORATION, Kawasaki (JP); TOHOKU UNIVERSITY, Sendai (JP)

(72) Inventors: Takayuki Saitoh, Kawasaki (JP); Takayuki Moriwaki, Kawasaki (JP); Takehito Shimatsu, Sendai (JP); Miyuki Uomoto, Sendai (JP)

(73) Assignees: CANON ANELVA CORPORATION, Kawasaki (JP); TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/962,061

(22) Filed: Oct. 7, 2022

(65) Prior Publication Data
US 2023/0051810 A1   Feb. 16, 2023

Related U.S. Application Data

(63) Continuation of application No. PCT/JP2022/004758, filed on Feb. 7, 2022.

(30) Foreign Application Priority Data

Feb. 10, 2021   (WO) ................. PCT/JP2021/004913

(51) Int. Cl.
*H01L 23/00*         (2006.01)
*C23C 14/08*         (2006.01)
(Continued)

(52) U.S. Cl.
CPC ............ *H01L 24/80* (2013.01); *C23C 14/083* (2013.01); *C23C 14/086* (2013.01); *C23C 14/10* (2013.01);
(Continued)

(58) Field of Classification Search
CPC ......... H01L 24/80; H01L 24/05; H01L 24/08; C23C 14/5853
See application file for complete search history.

(56) References Cited

U.S. PATENT DOCUMENTS 5,372,851 A * 12/1994 Ogawa ..................... B82Y 5/00
427/419.8
6,451,391 B1 * 9/2002 Yamada ................. C23C 14/28
427/586
(Continued)

FOREIGN PATENT DOCUMENTS

CN      102498542 A      6/2012
CN      105197881 A  *  12/2015
(Continued)

OTHER PUBLICATIONS

International Search Report (PCT/ISA/210) with translation and Written Opinion (PCT/ISA/237) dated Apr. 26, 2022, by the Japanese Patent Office as the International Searching Authority for International Application No. PCT/JP2022/004758. (9 pages).
(Continued)

*Primary Examiner* — Mamadou L Diallo
(74) *Attorney, Agent, or Firm* — BUCHANAN, INGERSOLL & ROONEY PC

(57) ABSTRACT

Substrates that are bonding targets are bonded in ambient atmosphere via bonding films, including oxides, formed on bonding faces of the substrates. The bonding films, which are metal or semiconductor thin films formed by vacuum film deposition and at least the surfaces of which are oxidized, are formed into the respective smooth faces of two substrates having the smooth faces that serve as the bonding faces. The bonding films are exposed to a space that contains moisture, and the two substrates are overlapped in the ambient atmosphere such that the surfaces of the bonding films are made to be hydrophilic and the surfaces of the
(Continued)

bonding films contact one another. Through this, a chemical bond is generated at the bonded interface, and thereby the two substrates are bonded together in the ambient atmosphere. The bonding strength $\gamma$ can be improved by heating the bonded substrates at a temperature.

43 Claims, 19 Drawing Sheets

(51) Int. Cl.
| | |
|---|---|
| H01L 21/50 | (2006.01) |
| H01L 23/10 | (2006.01) |
| H01L 23/20 | (2006.01) |
| C23C 14/10 | (2006.01) |
| C23C 14/16 | (2006.01) |
| C23C 14/35 | (2006.01) |
| C23C 14/58 | (2006.01) |

(52) U.S. Cl.
CPC ............ *C23C 14/165* (2013.01); *C23C 14/35* (2013.01); *C23C 14/5853* (2013.01); *H01L 21/50* (2013.01); *H01L 23/10* (2013.01); *H01L 23/20* (2013.01); *H01L 24/03* (2013.01); *H01L 24/05* (2013.01); *H01L 24/08* (2013.01); *H01L 2224/038* (2013.01); *H01L 2224/0345* (2013.01); *H01L 2224/05573* (2013.01); *H01L 2224/08145* (2013.01); *H01L 2224/80009* (2013.01); *H01L 2224/80055* (2013.01); *H01L 2224/80379* (2013.01); *H01L 2224/80896* (2013.01); *H01L 2224/80948* (2013.01); *H01L 2924/0533* (2013.01); *H01L 2924/0536* (2013.01); *H01L 2924/0549* (2013.01); *H01L 2924/05341* (2013.01); *H01L 2924/05342* (2013.01); *H01L 2924/05442* (2013.01)

(56) References Cited

U.S. PATENT DOCUMENTS

| | | | | |
|---|---|---|---|---|
| 8,557,679 | B2* | 10/2013 | Chuang | H01L 21/0206 |
| | | | | 438/455 |
| 9,892,920 | B1* | 2/2018 | Chen | H01L 21/324 |
| 2006/0189097 | A1* | 8/2006 | Maruyama | H01L 27/1266 |
| | | | | 438/455 |
| 2007/0110917 | A1* | 5/2007 | Okada | H01L 23/544 |
| | | | | 427/532 |
| 2009/0302482 | A1* | 12/2009 | Wang | H01L 21/02642 |
| | | | | 257/776 |
| 2010/0123369 | A1* | 5/2010 | Ono | H03H 9/1021 |
| | | | | 29/25.35 |
| 2012/0043859 | A1* | 2/2012 | Ichikawa | H03H 9/21 |
| | | | | 29/25.35 |
| 2012/0205747 | A1 | 8/2012 | Yamada et al. | |
| 2013/0320556 | A1 | 12/2013 | Liu et al. | |
| 2014/0159074 | A1* | 6/2014 | Isobe | H01L 27/3246 |
| | | | | 438/34 |
| 2015/0228622 | A1* | 8/2015 | Koyanagi | H01L 24/83 |
| | | | | 257/777 |
| 2016/0141263 | A1* | 5/2016 | Lin | H01L 33/0093 |
| | | | | 438/455 |
| 2017/0062366 | A1* | 3/2017 | Enquist | H01L 25/0657 |
| 2019/0189862 | A1* | 6/2019 | Ichinokura | H01L 33/54 |
| 2020/0006284 | A1* | 1/2020 | Chen | H01L 21/02126 |
| 2021/0040370 | A1* | 2/2021 | Yamashita | C08L 101/00 |
| 2021/0384884 | A1* | 12/2021 | Matsunaga | H03H 9/0509 |
| 2022/0319910 | A1* | 10/2022 | Larrey | H01L 21/76243 |
| 2023/0030272 | A1* | 2/2023 | Yamauchi | H01L 24/05 |

FOREIGN PATENT DOCUMENTS

| | | | | | |
|---|---|---|---|---|---|
| CN | 110651359 | A | * | 1/2020 | ........... B23K 20/001 |
| CN | 108382020 | B | * | 8/2021 | ............ B32B 15/01 |
| EP | 3905305 | A1 | * | 11/2021 | ............ C01B 32/21 |
| FR | 3025051 | A1 | * | 2/2016 | ............ H01L 24/03 |
| FR | 3027250 | A1 | * | 4/2016 | ........... H01L 21/187 |
| JP | 2009289953 | A | * | 12/2009 | |
| JP | 2012023326 | A | | 2/2012 | |
| JP | 5401661 | B2 | | 1/2014 | |
| JP | 2014022699 | A | | 2/2014 | |
| JP | 2014138136 | A | | 7/2014 | |
| JP | 5569964 | B2 | | 8/2014 | |
| JP | 2014221492 | A | | 11/2014 | |
| JP | 2015222970 | A | | 12/2015 | |
| JP | 2019117311 | A | * | 7/2019 | |
| JP | 2020065090 | A | | 4/2020 | |
| JP | 2021041458 | A | | 3/2021 | |
| WO | WO-2021045163 | A1 | * | 3/2021 | ............. C23C 14/08 |

OTHER PUBLICATIONS

Office Action issued on Sep. 17, 2023, by the Japan Patent Office in corresponding Japanese Patent Application No. 202280003691.3 (10 pages).

* cited by examiner

Bonding between
Au electrode portions
by Ti bonding film (0.5 nm)
(Example)

Direct bonding between
Au electrode portions
(without bonding film)
(Comparative Example)

Bonding between
Cu electrode portions
by Ti bonding film (0.3 nm)
(Example)

Bonding between
Cu electrode portions
by Mn bonding film (0.3 nm)
(Example)

Bonding between
Cu electrode portions
by Ti bonding film (0.5 nm)
(Example)

Bonding between
Cu electrode portions
by Mn bonding film (0.5 nm)
(Example)

CHEMICAL BONDING METHOD, PACKAGE-TYPE ELECTRONIC COMPONENT, AND HYBRID BONDING METHOD FOR ELECTRONIC DEVICE

FIELD OF THE INVENTION

The present invention relates to a chemical bonding method, a packaged electronic component including a package sealed by the chemical bonding method, and a hybrid bonding method for electronic devices using the chemical bonding method, and specifically to a chemical bonding method for improving the bonding method known as the "atomic diffusion bonding method," in which bonding surfaces of materials to be bonded, such as substrates and packages (referred to herein as "base materials"), are bonded through a thin film formed by vacuum deposition, a packaged electronic component including a package sealed by the chemical bonding method, and a hybrid bonding method for electronic devices.

BACKGROUND OF THE INVENTION

Bonding techniques that bond two or more materials to be bonded are used in various fields, and such bonding techniques are used for, for example, wafer bonding and package sealing in the field of electronic components.

Taking the above-described wafer bonding technique as an example, the related-art general wafer bonding technique is to apply high pressure and high heat between superimposed wafers to bond them.

However, this method of bonding cannot be used to bond or integrate base materials provided with electronic devices that are sensitive to heat or pressure. Therefore, there is a need for a technique to bond the base materials to be bonded without physical damage such as heat or pressure.

In the technology of three-dimensional (3D) integration of different devices, there is a bonding method called "hybrid bonding" as a method of connecting different devices in high density to increase the amount of data transfer per unit area and to suppress power loss and delay in wiring.

In this "hybrid bonding," as illustrated in FIG. 21, an insulating material with recesses is laminated on the surface of an electronic device, such as a silicon wafer, and a barrier metal and an electrode material such as copper (Cu) are laminated on top of the insulating material. This electrode material is often formed through a substrate. In many cases, the structure and size of the opposing electrode portions differ at the bonding surface.

Then, the electrode material and the insulating material are both polished by chemical mechanical polishing (CMP) or other polishing processes to form a bonding surface on the wafer with an electrode portion and an insulating portion around the electrode portion.

The bonding surfaces having an electrode portion and an insulating portion are formed on both of the electronic devices to be bonded, and then the two bonding surfaces are bonded together so that the electrode portions and insulating portions overlap each other, respectively. The structure and size of the opposing electrode portions and insulating portions may be different, as long as electrical continuity is achieved in the electrode portions to be bonded and electrical insulation is maintained in the insulating portions to be bonded after bonding. For example, it is possible to bond electrode portions with a very short pitch of from 5 to 1 μm in the connection of a silicon wafer and a silicon die, and from 25 to 5 μm in the connection of silicon wafers.

In such hybrid bonding, the surface of the electrode portions is usually formed into a dish shape with a depression in the center. Two bonding surfaces are overlaid with each other so that the insulating portions contact each other and then heated under pressure at a temperature of 350° C. or higher, 400° C. as an example, to thermally expand the metals of the electrode portions such as Cu to make contact and diffuse into each other, thus bonding the electrode portions. However, depending on the structure of the junction, the electrode portions may be formed slightly higher than the insulating portions, and the surface form of the bonding surface is not necessarily limited to this.

The heating required for bonding makes it difficult to accurately bond electrode portions and insulating portions formed at short pitches on two bonding surfaces together due to the difference in thermal expansion between the different wafers.

Therefore, there is a need for a bonding technology that can be applied to bonding wafers, including hybrid bonding in an unheated state or under heating at lower heating temperatures.

As one of such bonding techniques, a bonding method called "atomic diffusion bonding" has been proposed.

[Atomistic Diffusion Bonding]

In the atomic diffusion bonding, a microcrystalline thin film of a metal or semiconductor with a thickness on the order of nanometer and a large surface energy is formed as a bonding film on one smooth surface of a wafer, chip, substrate, package, or various other materials to be bonded (hereinafter referred to as "base material") by vacuum deposition such as sputtering and ion plating. This bonding film is then overlaid with the bonding film formed on the other smooth surface of the base material by a similar method or on the smooth surface of a base material having a microcrystalline structure under the same vacuum or atmospheric pressure as the bonding film was formed to enable bonding (see Patent Documents 1 and 2).

This atomic diffusion bonding can be used to bond any materials to be bonded that allow the formation of the above-described bonding film in a vacuum. Therefore, not only semiconductor and ceramics wafers, but also base materials of various materials such as metals, ceramics blocks, and polymers can be bonded, and in addition to bonding similar materials, different materials can be bonded without heating, preferably at room temperature (or low temperature).

Among these atomic diffusion bonding methods, bonding in a vacuum using a thin metal film of about a few angstroms (a few angstroms per side when bonding films together) as the bonding film on the bonding surface produces a bonding interface that is transparent and has almost no electrical conductivity, and is therefore being considered for use in bonding optical components and new functional devices.

However, even if the bonding film at the bonding interface is a thin metal film of only a few angstroms on each side, the thin film has characteristics similar to those of metal, which means that about 1 to 2% of light is absorbed at the bonding interface and a small amount of electrical conductivity remains, and this small amount of remaining light absorption and conductivity can be a problem in the formation of high brightness devices and electronic devices.

In order to solve this problem, a method for producing an elastic wave device has been proposed (Patent Document 3), in which the metal bonding film existing at the bonding interface is oxidized after bonding by atomic diffusion bonding to make it lose conductivity, thereby preventing characteristic degradation due to leakage of high frequency signals into the metal bonding film.

Specifically, Patent Document 3 discloses a method for producing an elastic wave device by laminating a thin film of piezoelectric material and a support substrate; first, an oxide base layer is formed on both bonding surfaces, and then a metal bonding film is formed on top of the oxide base layer, and then the bonding films are superimposed on each other for atomic diffusion bonding. Thereafter, heat treatment is performed and the bonding films are oxidized by the oxygen that deviates from the oxide base layer during the heat treatment to form a metal oxide film, thereby eliminating the degradation of the characteristics of the elastic wave device caused by the presence of metal bonding films at the bonding interface (see paragraphs [0012] to [0018], [0028] of Patent Document 3).

Moreover, this bonding method not only requires thickness control to form a very thin metal bonding film of a few A, but also requires a new process to form an oxidation base film, heat treatment for oxidation after atomic diffusion bonding, and control to stably supply the bonding film with the amount of oxygen that deviates from the oxidation base film during the heat treatment. As a result, there are many parameters that need to be controlled for mass production, and these become obstacles in increasing productivity.

In order to solve this problem, a bonding method has been proposed in which the aforementioned bonding films are formed by amorphous oxide films and the bonding films are overlaid with each other in a vacuum (Patent Document 4).

In this bonding method, amorphous oxide films with many atomic-level surface defects and high atomic mobility are used as bonding films, and the surface roughness of the bonding films is kept below the same level as the oxide's lattice constant, which allows bonding to occur at the contact interface of the two bonding films overlaid with each other in a vacuum by bonding elements such as metals and oxygen that constitute the amorphous oxide. This enables atomic diffusion bonding at room temperature using oxide thin films, which was previously thought to be impossible.

Although not a technology related to bonding through a bonding film such as the aforementioned atomic diffusion bonding, "optical contact," "fusion bonding," and "plasma-activated bonding" are technologies for bonding oxides in air.

[Optical Contact]

It is known as "optical contact" that when substrates and base materials of oxides, such as glass and sapphire, are polished smooth and brought into contact with each other, moisture in air adsorbs to the surface and hydrogen bonds are formed between the OH groups formed by the adsorption, which allows bonding to occur.

In this method, water adsorption fills the atomic-level gaps at the bonding interface and induces hydrogen bonding, making the bonding easy, but the bonding strength is relatively low because the bonding is hydrogen bonding.

[Fusion Bonding]

Fusion bonding is a wafer bonding technique that compensates for such shortcomings of optical contact and provides stronger bonding.

In this bonding method, the wafer surfaces are treated with hydrophilic treatment, the wafers are bonded at room temperature by hydrogen bonding of OH groups formed on the surfaces, and then heated to 600° C. or higher.

This leads to water desorption or decomposition of OH groups, and the diverged water or hydrogen diffuses at the bonding interface and solid phase diffusion of the wafer material occurs at the bonding interface by surface diffusion, resulting in complete base material integration.

When this technique is used for bonding Si wafers, it is called, for example, direct bonding of silicon, and the heating temperature is usually 800° C. or higher.

[Plasma-Activated Bonding]

The fusion bonding method described above requires heating at high temperatures, making it impossible to bond or integrate wafers with heat-sensitive electronic devices.

In order to cope with this problem, low-temperature bonding by irradiating oxygen or nitrogen plasma has been proposed, and this technique is called plasma-activated bonding.

In this plasma-activated bonding, plasma irradiation removes contaminants from the base material surface, and modifies and oxidizes the surface to increase hydrophilicity (Patent Documents 5 and 6).

The increase in hydrophilicity allows water to be adsorbed more efficiently, which in turn allows the bonding temperature to be lowered to about 400° C.

RELATED ART DOCUMENTS

Patent Document

[Patent Document 1] Japanese Patent No. 5401661
[Patent Document 2] Japanese Patent No. 5569964
[Patent Document 3] Japanese Patent KOKAI No. 2015-222970 (LOPI; automatically published after around 18 months from filing date regardless prosecution)
[Patent Document 4] Japanese Patent KOKAI No. 2020-98031
[Patent Document 5] Japanese Patent KOKAI No. 2014-138136
[Patent Document 6] Japanese Patent KOKAI No. 2020-65090

SUMMARY OF THE INVENTION

Problems to be Solved by the Invention

The bonding method using amorphous oxide films as bonding films, introduced as Patent Document 4 above, has the advantage that it can bond base materials of different materials as well as base materials of the same material, as long as the base materials are capable of forming amorphous oxide films.

In addition, the aforementioned bonding method in a vacuum using amorphous oxide films as bonding films can bond base materials with a relatively high bonding strength, although the bonding strength tends to decrease as the electronegativity of the amorphous oxide films used as bonding films increases (i.e., as the covalent bonding property increases). Therefore, if the bonding films are formed with a substance of low electronegativity, it is possible to achieve bonding so strong that the base materials cannot be peeled off from each other (the base material portions will break if peeled off forcibly).

However, in this method, the entire process from the formation of the amorphous oxide films as bonding films on the base materials to the bonding by overlaying the base materials with each other must be performed continuously in a vacuum, making the bonding process complex and requiring expensive bonding equipment, which increases the cost of bonding.

In particular, it is difficult to overlay electrode portions, which have been formed at a short pitch, with each other with high precision in a vacuum, as in the hybrid bonding described above, and such bonding in a vacuum is difficult to apply to hybrid bonding.

On the other hand, some of the application fields of bonding using oxide thin films as bonding films do not require bonding strength as high as that obtained when bonding in a vacuum as described above.

Therefore, in such application fields, there is a strong demand for bonding in air, in which the base materials are taken out from a vacuum apparatus, even at the expense of bonding strength. If such bonding becomes possible, the bonding process, including positioning of base materials such as wafers, can be performed outside the vacuum vessel with relative ease, and bonding can be performed economically, easily, and accurately.

However, when the oxide thin films formed as bonding films by vacuum deposition are taken out to air, water molecules in air immediately adsorb onto them and bond with elements such as metals and oxygen in the oxide film surfaces to stabilize the surface chemical state.

Therefore, it was the understanding of the person skilled in the art, including the inventors of the present invention, that even if two base materials with bonding films made of oxide thin films are taken out from a vacuum vessel and overlaid with each other in air, the base materials cannot be bonded together, and that bonding using oxide thin films as bonding films requires the entire process from film formation to overlaying of the base materials to be performed in a vacuum.

On the other hand, as mentioned above, there are some bonding technologies for electronic devices that allow bonding in air, such as plasma-activated bonding.

However, in the plasma-activated bonding described in Patent Document 5, although bonding in air is possible, the surfaces of the wafers to be bonding surfaces are modified by plasma treatment, followed by surface modification to hydrophilize the wafer surfaces. In order to oxidize the wafer surfaces in this surface modification process, the wafers must be oxidizable materials. Since the degree of oxidation depends on the wafer material, which limits the wafer materials that can be bonded.

In addition, surface modification for hydrophilization involves a wet process using pure water or chemical solutions, which requires a drying process and drainage facilities, making this bonding method very costly.

In the plasma-activated bonding described in Patent Document 6, the wafers are cleaned, storage areas for storing the raw material are formed on the surface layers of the wafers. The wafers are temporarily bonded and then reacted with the raw material in the storage areas for bonding.

Therefore, even in the plasma-activated bonding described in Patent Document 6, a wet process is required to clean wafers, which requires a drying process and drainage facilities, making this bonding method very costly.

In addition, since the storage area is formed by plasma activation of the surface layer of the wafer and the bonding strength is increased by reacting the raw material stored in the storage area with the wafer material, this bonding method also requires reaction of the wafer material with the raw material, which limits the wafer materials that can be bonded.

Both fusion bonding and plasma-activated bonding require heating of at least 400° C. for bonding, and when the bonding method is applied to the hybrid bonding, the aforementioned problem of difficulty in bonding wafers of different materials with thermal expansion differences is still not solved.

In addition, if bonding at lower temperatures, especially 150° C. or lower, becomes possible, for example, in the field of image sensors, bonding of devices with low heat resistance, such as organic ELs, will also become possible. Therefore, there is a high demand for bonding without heating or with heating at a relatively low temperature.

[Idea of Bonding in Air Using Thin Oxide Thin Film]

As described above, it has been believed that when an oxide thin film deposited in a vacuum is taken out to air, water molecules in air adsorb and combine with elements such as metals and oxygen on the surface of the oxide thin film to stabilize the chemical state of the surface, making it impossible to bond by the atomic diffusion bonding described above.

However, as seen in the aforementioned plasma-activated bonding, it is possible to bond base materials by modifying and hydrophilizing the surfaces of the oxide base materials. Therefore, if the surface of oxide thin films can be hydrophilized, it should be possible to bond oxide thin films in air, even if the bonding strength does not reach that of bonding in a vacuum.

Since moisture in the atmosphere is adsorbed on the surface of the oxide thin film after vacuum deposition and taking out to air as described above, the surface is hydrophilic even without surface modification such as the plasma-activated bonding described above. Therefore, the inventors of the present invention though that it might be possible to bond oxide thin films together if the overlaying is performed while the surfaces are in a hydrophilic state, i.e., before surface contamination by organic molecules progresses over time and the surface chemical state becomes stabilized and changes to hydrophobic.

If such bonding is possible, compared to the bonding using oxide thin films formed by vacuum deposition as bonding films described in Patent Document 4, the restriction of overlaying in a vacuum vessel will be eliminated, and the base materials can be taken out from a vacuum vessel and overlaid with each other in air.

If hydrophilization of the bonding film surface can be achieved simply by taking it out from the vacuum vessel and exposing it to air, then, in comparison with the aforementioned plasma-activated bonding, there is no need to perform wet processes for cleaning and hydrophilization and plasma treatment for wafer surface modification, and the cost for bonding can be significantly reduced.

The aforementioned plasma-activated bonding process directly hydrophilizes the surface of the base material itself, so there are restrictions on the base material materials that can be bonded. However, if bonding becomes possible through the formation of an oxide thin film by vacuum deposition and hydrophilization of the bonding film surface, it will be possible to bond any base material capable of forming an oxide thin film, regardless of its material, and this will greatly expand the range of bonding targets, which is an extremely significant advantage.

Based on the above viewpoint, the inventors of the present invention have repeatedly experimented and found that the oxide thin film deposited by vacuum deposition can be used as a bonding film to bond base materials even in air.

As a result of the above experiments, it was found that the bonding film does not need to be a complete oxide thin film, but can be bonded in air as long as at least its surface is oxidized.

The present invention has been made as a result of the aforementioned points of view and experiments based on the aforementioned points of view by the inventors, and is intended to provide a bonding method that enables bonding between base materials using an oxide thin film, which has been oxidized at least on its surface, as a bonding film even by overlaying in air.

Means for Solving the Problem

In order to achieve the object, a chemical bonding method of the present invention comprises:

a step of forming a bonding film, which is a thin film of a metal or semiconductor formed by vacuum deposition and oxidized at least on its surface, on each smooth surface of two base materials having smooth surfaces;

a step of exposing the surfaces of the bonding films formed on the two base materials to a space having moisture to hydrophilize the surfaces of the bonding films; and a step of bonding the two base materials by overlaying them with each other so that the surfaces of the bonding films in a hydrophilic state contact each other.

Moreover, a chemical bonding method of the present invention comprises:

a step of forming a bonding film, which is a thin film of a metal or semiconductor formed by vacuum deposition and oxidized at least on its surface, on one of the smooth surfaces of two base materials having smooth surfaces;

a step of exposing the surface of the bonding film to a space having moisture to hydrophilize the surface of the bonding film; and a step of bonding the two base materials by overlaying them with each other so that the surface of the bonding film in a hydrophilic state contacts the oxide thin film of a metal or semiconductor formed on the smooth surface of the other base material.

Furthermore, another chemical bonding method of the present invention comprises:

a step of forming a bonding film, which is a thin film of a metal or semiconductor formed by vacuum deposition and oxidized at least on its surface, on one of the smooth surfaces of two base materials having smooth surfaces;

a step of exposing the surface of the bonding film to a space having moisture to hydrophilize the surface of the bonding film; and a step of bonding the two base materials by overlaying them so that the surface of the bonding film in a hydrophilic state contacts the smooth surface of the other base material, which comprises a hydrophilized or activated metal or semiconductor, or an oxide thereof.

In any methods described above, a step of further heating the base materials after the bonding may be comprised.

In such case, it is preferable that the heating is performed at a temperature of 400° C. or lower.

The overlaying of the two base materials may be performed in air.

The bonding films may be the oxide thin films formed by vacuum deposition such as sputtering using oxide target or reactive sputtering with oxygen as reactive gas.

Furthermore, the bonding films may be formed by oxidizing at least the surface of the thin films of a metal or semiconductor formed by vacuum deposition such as sputtering, by introducing oxygen into a vacuum vessel or by taking out the base material to air, for example.

Furthermore, it is desirable that the bonding films are formed as films with many defects for example, by sputtering or other methods involving rapid cooling of the raw material atoms on the smooth surface of the base material.

The hydrophilization of the surfaces of the bonding films may be performed by taking out the base materials having the bonding films from a vacuum vessel to air, or, may be performed by introducing moisture into the vacuum vessel in which the vacuum deposition has been performed.

Preferably, the bonding films are formed to have a surface roughness with an arithmetic mean height Sa of 0.5 nm or less.

A packaged electronic component of the present invention is the one of which package sealing is performed by the above mentioned chemical bonding method, and the packaged electronic component with the electronic component sealed inside a hollow package formed by bonding a package body to a lid, wherein a junction between the package body and the lid comprises an intermediate layer comprising a first thin film of a metal or semiconductor oxidized at least on its surface formed on a smooth surface of the package body and a second thin film of a metal or semiconductor oxidized at least on its surface formed on a smooth surface of the lid, an interface between the first and second thin films of the intermediate layer is bonded by chemical bonding, and a hollow space of the package is sealed with a gas at atmospheric pressure.

The "atmospheric pressure" in the present invention can include, for example, a slightly lower or higher pressure than atmospheric pressure, such as the sealing pressure when the above packages are sealed in a negative pressure or positive pressure clean room, which can be regarded as atmospheric pressure.

For another packaged electronic component of the present invention, the packaged electronic component with an electronic component sealed inside a hollow package formed by bonding a package body to a lid, wherein a junction between the package body and the lid comprises an intermediate layer comprising a thin film of a metal or semiconductor oxidized at least on its surface formed on a smooth surface of either the package body or the lid, an interface between the intermediate layer and a smooth surface of the other of the package body or the lid, which comprises a metal, semiconductor, or oxide thereof, is bonded by chemical bonding, and a hollow space in the package is sealed with a gas at atmospheric pressure.

In any of the above mentioned packaged electronic components, an inert gas as the gas at atmospheric pressure may be sealed.

In the configuration of the packaged electronic component, it is desirable that when the intermediate layer includes first and second thin films, one or both of the first and second thin films is/are made of oxide thin films with many defects, and when the intermediate layer is made of a thin film formed on the smooth surface of either the package body or the lid, the thin film is made of an oxide thin film with many defects.

Furthermore, a hybrid bonding method for electronic devices of the present invention comprises forming a bonding surface that is at least partially smooth and has an electrode portion and an insulating portion on each of the two electronic devices to be bonded, and bonding the two bonding surfaces by aligning the electrode portions and the insulating portions with each other, wherein the bonding between the two bonding surface comprises:

a step of forming a bonding film on each of the two bonding surfaces, which is a thin film of a metal or semiconductor formed by vacuum deposition and oxidized at least on its surface, a step of exposing the surfaces of the bonding films formed on the two bonding surfaces to a space having moisture to hydrophilize the surfaces of the bonding films, and a step of overlaying the two bonding surfaces with each other and bonding them together so that the surfaces of the bonding films in a hydrophilic state contact each other with the electrode portions and the insulating portions of the two bonding surfaces aligned with each other, wherein the bonding through the bonding films provides continuity between the electrode portions of the two bonding surfaces and makes the insulating portions electrically insulated.

Furthermore, for another hybrid bonding method for electronic devices of the present invention, the hybrid bonding method for electronic devices comprises forming a bonding surface that is at least partially smooth and has an electrode portion and an insulating portion on each of the two electronic devices to be bonded, and bonding the two bonding surfaces by aligning the electrode portions and the insulating portions with each other, wherein the bonding between the two bonding surface comprises:

a step of forming a bonding film on one of the bonding surfaces, which is a thin film of a metal or semiconductor formed by vacuum deposition and oxidized at least on its surface, a step of exposing the surface of the bonding film to a space having moisture to hydrophilize the surface of the bonding film, a step of bonding the two bonding surfaces by overlaying them so that the surface of the bonding film in a hydrophilic state contacts the oxide thin film of a metal or semiconductor formed on the other bonding surface with the electrode portions and the insulating portions of the two bonding surfaces aligned with each other, wherein the bonding through the bonding film provides continuity between the electrode portions of the two bonding surfaces and makes the insulating portions electrically insulated.

Furthermore, for another hybrid bonding method for electronic devices of the present invention, the hybrid bonding method comprises forming a bonding surface that is at least partially smooth and has an electrode portion and an insulating portion on each of the two electronic devices to be bonded, and bonding the two bonding surfaces by aligning the electrode portions and the insulating portions with each other, wherein the bonding between the two bonding surface comprises:

a step of forming a bonding film, which is a thin film of a metal or semiconductor formed by vacuum deposition and oxidized at least on its surface, on one of the bonding surfaces after forming the electrode portions and insulating portions, a step of exposing the surface of the bonding film to a space having moisture to hydrophilize the surface of the bonding film, a step of bonding the two bonding surfaces by overlaying them with each other so that the surface of the bonding film in a hydrophilic state contacts the other hydrophilized or activated bonding surface with the electrode portions and the insulating portions of the two bonding surfaces aligned with each other, wherein the bonding through the bonding film provides continuity between the electrode portions of the two bonding surfaces and makes the insulating portions electrically insulated.

The bonding films may be formed by oxidizing at least the surfaces of the thin films of a metal or semiconductor formed by vacuum deposition.

Moreover, the hybrid bonding method may comprise the step of which the bonding by overlaying the bonding surfaces is followed by a step of heating at a temperature of 300° C. or lower.

Furthermore, a thickness of the bonding films is preferably from 0.3 nm to 5 nm, and more preferably from 0.3 nm to 3 nm.

Effect of the Invention

According to the configuration of the present invention described above, the following remarkable effects could be obtained according to the bonding method of the present invention.

A bonding film includes a metal or semiconductor, which is a thin film formed by vacuum deposition and has been oxidized at least on its surface by deposition using an oxide as the starting material or by oxidation during or after deposition, was formed on the smooth surface of at least one of the two base materials to be bonded, and the surface of the bonding film was hydrophilized by exposure to a space containing moisture such as air.

While the bonding films are in a hydrophilic state, i.e., before they become hydrophobic due to stabilization by surface contamination by organic molecules, the bonding films are overlaid with each other, or the bonding film and an oxide thin film formed on the smooth surface of the other base material, or a hydrophilized or activated smooth surface of the other base material including a metal, semiconductor, or oxide thereof are overlaid with each other. This allowed bonding to occur even in air, and the base materials could be bonded together without the need for the complex bonding process of overlaying the base materials in a vacuum vessel.

Since it is no longer necessary to bond in a vacuum, the package body and lid of a hollow package for electronic components can be bonded as the aforementioned base materials by the chemical bonding method of the present invention. This also makes it possible to obtain a packaged electronic component in which an atmospheric gas, such as an inert gas at atmospheric pressure, is sealed inside the package together with electronic components.

Furthermore, since there is no need to bond in a vacuum, when the chemical bonding method of the present invention is applied to the aforementioned "hybrid bonding," electronic devices taken out from the vacuum vessel can be overlaid with each other, for example, in air, which facilitates high-precision alignment and overlaying of electrode portions and insulating portions formed on the bonding surfaces of the devices.

Furthermore, unlike the aforementioned plasma-activated bonding, bonding can be performed without plasma irradiation for surface modification of the bonding film or wet processing for hydrophilicity.

Unlike plasma-activated bonding, where bonding is achieved by surface modification of the base material itself, the bonding method of the present invention can bond any base material that can form a bonding film, regardless of its material, and can also bond a combination of different materials.

In a configuration that includes a step of further heating the base materials after bonding them by overlaying, it is possible to further increase the bonding strength of the base materials.

Therefore, for applications requiring bonding strength, it is possible to temporarily bond the base materials by overlaying them with each other and then perform the main bonding by subsequent heating.

Heating in the range of 400° C. or lower, about 300° C. as an example, can significantly improve bonding strength, while heating at 400° C. or lower can increase bonding strength with little damage to electronic devices and others, even when they are mounted on a base material.

Since bonding can be performed without heating or with heating at a relatively low temperature in this manner, even in the case of hybrid bonding between wafers made of dissimilar materials, a decrease in the alignment accuracy between electrode portions and insulating portions because of the difference in thermal expansion of the wafers can be prevented, enabling electrodes to be formed at shorter pitches.

As described with reference to FIG. 21, the bonding surface of a device to be hybrid bonded is mirror polished by chemical mechanical polishing (CMP) or other method, so that when a copper (Cu) electrode portion is provided on the bonding surface, a bonding film is formed on the copper oxide film (Cu—O) formed on the surface of the copper (Cu) electrode portion during mirror polishing or other process, which may prevent continuity between the electrode portions after bonding.

In the case of bonding electrode portions with copper oxide film (Cu—O) formed by mirror polishing, etc., heating after bonding is effective in diffusing oxygen from the copper oxide film (Cu—O) on the surface of the electrode to achieve continuity.

Generally, heating to 300 to 350° C. is required to diffuse the oxygen in the copper oxide film (Cu—O) produced by mirror polishing or other method, and to obtain continuity. If the material of the bonding film is effective in promoting the dissociation of oxygen from the copper oxide film of copper on the surface of the electrode portion during heating, it is also possible to achieve continuity between the electrode portions at lower temperatures, for example, lower than 300° C., as an example, at about 200° C.

As in ordinary hybrid bonding, electrode portions may be bonded together as follows: the surfaces of the electrode portions are formed into a dish shape with a depression in the center, and the two bonding surfaces are overlaid with each other so that the insulating portions come into contact with each other. Then, the metal of the electrode portions, such as Cu, is heated under pressure at 400° C. or lower, about 300° C. as an example, to cause thermal expansion to make contact, forming bonding films on the surfaces of the electrode portions, which are then brought into contact with each other.

Furthermore, the height of one or both electrode portions may be formed higher than that of the insulating portion, and the electrode portions may be overlaid with each other so that they contact each other for bonding. That is, the structure and size of the opposing electrode portions and insulating portions are not limited as long as electrical continuity is obtained for the electrode portions to be bonded and electrical insulation is maintained for the insulating portions after bonding.

By forming the bonding film on the smooth surface of the base material as a film with many defects, for example, by sputtering or other methods involving rapid cooling of the raw material atoms on the smooth surface of the base material, the bonding with the OH groups of the water molecules is efficiently enhanced at the atomic level, and the bonding performance can be improved.

The bonding strength of the bonding film formed on the smooth surface of the base material decreases as the surface roughness increases, but the bonding strength can be secured by forming the bonding film with a surface roughness of equal to or less than Sa 0.5 nm in terms of arithmetic mean height.

EMBODIMENTS FOR CARRYING OUT THE INVENTION

Figure 1:
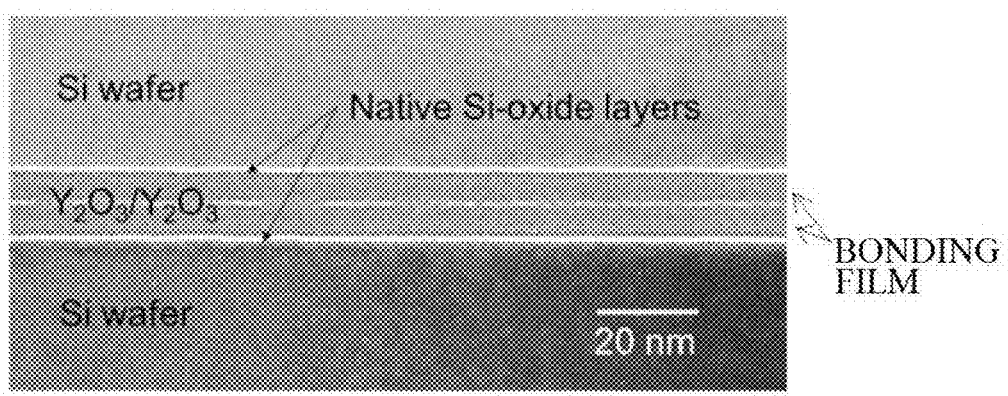
FIG. 1 is a cross-sectional electron micrograph (TEM) of Si substrates bonded with $Y_2O_3$ thin films as bonding films.

The bonding of base materials using the chemical bonding method of the present invention is described below.

[Overview of Bonding Method]

The bonding of base materials by the chemical bonding method of the present invention is performed using a thin film of a metal or semiconductor, which is formed by vacuum deposition such as sputtering or ion plating and has been oxidized at least on its surface, including bonding the base materials by causing chemical bonds at the bonding interface by:

i) exposing both of the bonding films formed on the smooth surfaces of the two base materials to be bonded to a space containing moisture to hydrophilize them, and then overlaying them with each other, or ii) exposing the bonding film formed on the smooth surface of one of the base materials to be bonded to a space containing moisture to hydrophilize it, and then overlaying it in air with an oxide thin film of a metal or semiconductor formed on the smooth surface of the other base material, or iii) exposing the bonding film formed on the smooth surface of one of the base materials to be bonded to a space containing moisture to hydrophilize it, and then overlaying it in air with a smooth surface of the other base material made of a hydrophilic or activated metal, semiconductor, or oxide thereof.

[Base Material (Material to be Bonded)]

(1) Material

The base material to be bonded by the chemical bonding method of the present invention may be any material on which the bonding film, which will be described below in detail, can be formed by vacuum deposition in a high vacuum atmosphere using a vacuum vessel with an achieved degree of vacuum of from $1\times10^{-3}$ to $1\times10^{-8}$ Pa, preferably from $1\times10^{-4}$ to $1\times10^{-8}$ Pa, as an example. In addition to various pure metals and alloys, semiconductors such as Si wafers and $SiO_2$ base materials, glass, ceramics, resins, oxides, etc. that can be vacuum deposited using the above method may be used as the base material (material to be bonded) in the present invention.

The two base materials may be a combination of different materials, such as metal and ceramics, as well as a combination of the same material, and even such a combination of different materials can be bonded suitably according to the bonding method of the present invention.

(2) State and Other Properties of Bonding Surface

The shape of the base material is not particularly limited, and may be any shape from a flat plate to various complex three-dimensional shapes, depending on the application and purpose. However, the part to be bonded with the other base material (bonding surface) must have a smooth surface formed with a predetermined accuracy.

A plurality of base materials may be bonded to one base material by providing a plurality of smooth surfaces to be bonded on one base material.

The smooth surface is formed to surface roughness that enables the surface roughness of the formed bonding film or oxide thin film to be 0.5 nm or less in arithmetic mean height Sa (ISO 4287) when the bonding film or oxide thin film described below is formed on this smooth surface. When the smooth surface is directly overlaid with the bonding film after hydrophilization or surface activation, the smooth surface of the base material itself is formed with an arithmetic mean height Sa of 0.5 nm or less.

The structure that can be bonded to the base material is not particularly limited and various structures can be bonded to the base material, including single crystal, polycrystalline, amorphous, and glassy structures. When the bonding film described below is formed on only one of the two base materials and the other base material is bonded without forming a bonding film, the bonding surface of the other base material without the bonding film must be formed with an oxide thin film so that chemical bonding readily occurs, or subjected to hydrophilization, or activated by removing the oxidized and contaminated layers from the base material surface by dry etching to facilitate chemical bonding.

[Bonding Film]

(1) General Materials

The bonding film used for bonding must be oxidized at least on its surface, and can be formed, for example, as a thin oxide thin film that is entirely oxidized to the interior.

The material of this bonding film is not limited as long as it forms an oxide that is stable in a vacuum and in air, and various metals, semiconductors, and their oxides may be used as the material of the bonding film.

(2) Surface Roughness of Bonding Film

In order to improve the bonding strength, the bonding interface between the bonding films, between the bonding film and the oxide thin film, or between the bonding film and the smooth surface of the other base material needs to be bonded to a greater extent.

However, if the surface of the bonding film is uneven, only the contact areas between convex portions are bonded in a point-contact state, resulting in a narrow junction and low bonding strength even if bonding is possible.

Therefore, it is preferable that the surface of the bonding film can be brought into contact over the entire area of the film surface at the atomic level during bonding so that increased bonding strength can be obtained.

Such atomic-level contact can be achieved by making the surface roughness (arithmetic mean height Sa) of the bonding film as large as the unit cell when the oxide formed on at least the surface of the bonding film is crystalline.

Table 1 below shows the crystal structures and lattice constants of typical oxides.

As is clear from Table 1, the lattice constants of the representative oxides listed below range from 0.3 to 0.5 nm. In order to make the surface roughness of the bonding film as large as the unit cell of the oxide that constitutes at least the surface of the bonding film, the arithmetic mean height (Sa) should be equal to or less than 0.5 nm, which is the upper limit of the numerical range of the above lattice constant, preferably sufficiently smaller than 0.5 nm, and even more preferably 0.3 nm or less, which is the lower limit of the numerical range of the above lattice constant, thereby making it possible to contact the bonding interface at the atomic level via bonding with the OH groups of the adsorbed water molecules.

TABLE 1

| Crystal structures and lattice constants of typical oxides | | | | |
|---|---|---|---|---|
| Composition | TiO$_2$ | ZrO$_2$ | ZnO | MgO |
| Crystal structure | Tetragonal crystal (rutile type) | Tetragonal crystal | Hexagonal crystal (6 mm) | Tetragonal crystal |
| Lattice constant (nm) | a = 0.459 c = 0.296 | a = 0.515 | a = (b=) 0.325 c = 0.521 | a = 0.421 |

(3) Deposition Method

The method for forming a bonding film is not particularly limited as long as it is vacuum deposition capable of forming a thin film of metal, semiconductor, or oxide thereof on a smooth surface of a base material in a vacuum, and the bonding film may be formed by various known methods.

Such a bonding film formed by vacuum deposition has many structural defects inside the film due to the rapid cooling (quenching) of high-temperature gas phase and liquid phase atoms as they reach the smooth surface of the base material during deposition, which facilitates the generation of bonds with the OH groups of water molecules and thus chemical bonds at the bonding interface.

In particular, the film can incorporate a large amount of oxygen defects and supersaturated oxygen, and sputtering, which is easy to control these elements, and vapor deposition in combination with oxygen plasma (oxygen radicals) can be suitably used for the formation of the bonding film in the present invention.

As the bonding film, a thin film of a metal or semiconductor that is oxidized at least on its surface can be used for bonding. For example, in applications where transparency and insulation are required in the junction, the bonding film is formed as an oxide thin film that is entirely oxidized.

When the bonding film as such an oxide thin film is formed by sputtering or evaporation with oxygen plasma (oxygen radicals), an oxide target may be sputtered, or an oxide solid may be evaporated and deposited, in which the starting material of the deposition is an oxide. Alternatively, the film may be formed by deposition by a method such as reactive sputtering, in which an oxide formed by reacting an oxide-forming element and oxygen in a vacuum vessel is deposited on the smooth surface of the base material.

In this case, the bonding performance may be enhanced by controlling oxygen defects and supersaturated oxygen to increase the defects inside the film to increase the bonding density of water molecules with OH groups and the atomic mobility on the film surface, or by depositing only a few atomic layers of the surface layer of the bonding film under conditions that result in such a defect-rich condition.

Furthermore, after forming a metal or semiconductor thin film by sputtering or vapor deposition, the metal or semiconductor thin film formed by vacuum deposition is subsequently oxidized to form an oxide thin film by introducing oxygen into the vacuum vessel or by taking out the base material on which the metal or semiconductor thin film is formed to air, and the oxide thin film may be used as the aforementioned bonding film.

The surface of the oxide thin film formed in this manner can form many defects as oxide.

For applications where properties such as transparency and insulation are not required of the bonding film, the bonding film should be oxidized at least on its surface. As described above, a thin film of a metal or semiconductor formed by vacuum deposition may be exposed to a space containing oxygen under conditions such that only its surface portion is oxidized to obtain the aforementioned bonding film.

In general, the surface roughness of thin films formed by vacuum deposition increases as the film thickness increases. Therefore, if it is necessary to form a relatively thick bonding film, the energy treatment sputtering (ETS) method, which performs sputtering deposition and ion etching simultaneously, may be used to obtain a bonding film with the aforementioned surface roughness (arithmetic mean height Sa of 0.5 nm or less), or the bias sputtering method, in which sputtering is performed while a bias is applied to the substrate, may be used for deposition.

The ETS method and the bias sputtering method can form thick bonding films while maintaining a small surface roughness.

The ETS method and bias sputtering method also have significant industrial advantages, such as the ability to form thick oxide thin films with small surface roughness even when the surface roughness of the base material is relatively large, and the elimination of the need for high-precision polishing of the base material surface.

(4) Degree of Vacuum

Impurity gases such as oxygen, water, and carbon remaining in the vacuum vessel are incorporated into the bonding film to be formed, and degrade the physical properties of the bonding film.

In addition, when impurity gases such as oxygen and carbon in the vacuum vessel are adsorbed on the surface of the formed bonding film, they stabilize the chemical state of the surface and inhibit the chemical bonding of the bonding film at the bonding interface.

Therefore, the achieved degree of vacuum of the vacuum vessel must be higher than $10^{-3}$ Pa, which is equal to or less than one hundredth of $10^{-1}$ Pa, where the mean free path of residual gas is equal to the size of the vacuum vessel.

In order to suppress gas adsorption on the surface of the bonding film, the degree is more preferably better than $10^{-4}$ Pa, which is equivalent to 1 Langmuir.

It is even better and more ideal to perform thin film formation and bonding in an ultra-high vacuum environment of $10^{-6}$ Pa or lower, while maintaining the purity of the oxygen and other additive gases.

(5) Thickness of Bonding Film to be Formed

In order to obtain the physical properties of a bonding film, the thickness of the film must be at least equal to or greater than the lattice constant (from 0.3 to 0.5 nm from Table 1 above) when the oxide constituting the bonding film to be formed is crystalline, and the lower limit is 0.3 nm, preferably 0.5 nm.

On the other hand, when insulating properties are required for a bonding film, a thick thin film may be required from the viewpoint of breakdown voltage. When optical properties are required for a bonding film, a thin film with a certain thickness may be required from the viewpoint of wavelength.

However, in general deposition methods, increasing the thickness increases the surface roughness, which degrades the bonding performance.

In this regard, according to the ETS method or bias sputtering method described above, it is also possible to form bonding films with small surface roughness while increasing the thickness. However, a very long deposition time is required to deposit a bonding film of 5 μm or more, which makes it difficult to form industrially. Therefore, the upper limit of the thickness of the bonding film is 5 μm, preferably 1 μm.

Therefore, the thickness of the bonding film is preferably from 0.3 nm to 5 μm, and more preferably from 0.5 nm to 1 μm.

[Hydrophilization Treatment]

The bonding film formed on the smooth surface of the base material as described above is exposed to a space containing moisture before the base material is overlaid with another base material, causing moisture to be adsorbed to the base material surface to hydrophilize the surface.

Such hydrophilization may be performed by taking out the base material with a bonding film formed by vacuum deposition from a vacuum vessel to air, whereby moisture in air is adsorbed to the surface of the bonding film.

The hydrophilization of the bonding film may be performed in a vacuum vessel by introducing moisture or air containing moisture into the vacuum vessel in which the bonding film is deposited.

As described above, in a configuration where a thin (unoxidized) film of a metal or semiconductor is deposited by vacuum deposition, and this thin film of a metal or semiconductor is exposed to an oxygen-containing space after deposition for subsequent oxidation, the base material with a thin film of a metal or semiconductor formed by vacuum deposition may be taken out to air to simultaneously perform oxidation and hydrophilization.

[Overlaying of Base Materials]

The two base materials are overlaid with each other so that the surfaces of the bonding films, which are in a hydrophilic state, come into contact with each other, thereby causing a chemical bond at the interface of the bonding films.

This overlaying of the base materials must be done so that the "bonding films in a hydrophilic state" are in contact.

When the bonding film is hydrophilized by taking it out to air, the surface of the bonding film eventually becomes hydrophobic due to surface contamination by organic molecules and chemical stabilization over time. However, bonding must be performed when the film is in a hydrophilic state, before it becomes hydrophobic.

Although the time for which such hydrophilicity is maintained depends on the material of the bonding film to be formed, hydrophilicity is maintained for a relatively long time when hydrophilicity is maintained by taking out to air (thus, bonding is possible for a relatively long time).

For example, in a bonding test conducted by forming a 5 nm ITO thin film as a bonding film on each of two quartz substrates, the bonding strength hardly changed within 2 hours after the substrates were taken out to air, and gradually decreased after 2 hours. However, even after 24 hours, the bonding strength remained high compared to the bonding strength immediately after taking out, about 70% without heating and about 90% after heating to 300° C. After 165 hours (1 week), the bonding strength remained at about 40% of the bonding strength without heating and 70% after heating to 300° C.

Thus, as the exposure time increases, surface contamination by organic molecules progresses over time and the surface becomes chemically stabilized and hydrophobic, resulting in a decrease in bonding strength. However, since hydrophilization by taking out to air is maintained for a relatively long period of time, and thus the bonding is maintained for a relatively long time, the time between taking out and bonding should be controlled according to the required bonding strength.

In the chemical bonding method of the present invention, the hydrophilization of the bonding films and the overlaying of the base materials may be performed in air. When the hydrophilization of the bonding films is performed by introducing moisture into the vacuum vessel as described above, the base materials with the hydrophilized bonding films may be bonded by taking them out from the vacuum chamber and overlaying them with each other in an inert gas atmosphere.

By this configuration, for example, when an electronic device package is bonded (sealed) by the method of the present invention, an inert gas may be sealed in the package together with the electronic device to protect the electronic device from degradation due to oxidation or other causes.

[Hydrophilization/Activation of Other Base Material] (when Bonding Film is Formed on Only One Side)

In the chemical bonding method of the present invention, a bonding film is formed only on the smooth surface of one base material to be bonded, and an oxide thin film is formed on the smooth surface of the other base material by a known method. Alternatively, bonding may be performed by overlaying the smooth surface of one base material with a bonding film on a surface that has been hydrophilized or activated by a known method to facilitate chemical bonding.

The aforementioned oxide thin film formed on the other base material need not be of the same material as the bonding film formed on the smooth surface of one base material, and these films may be of different materials.

In the bonding method, activation of the smooth surface of the other base material may be performed in the same vacuum as the formation of the bonding film by removing oxidized or contaminated layers from the smooth surface of the other base material by dry etching or other process.

The material of the other base material may be a metal, a semiconductor such as Si, or even an oxide of these materials, as long as the base material can be hydrophilized or activated to facilitate chemical bonding, and the material is not particularly limited.

By using this bonding method, where the bonding film is formed only on the smooth surface of one base material, the bonding film formed by the oxide thin film can be used for electrical insulation between the base materials to be bonded and for adjusting the optical characteristics between the base materials.

[Heating after Bonding]

The base materials bonded in the above manner may be further heated by a known method after bonding to increase the bonding strength $\gamma$.

The heating temperature is not particularly limited, but in the case of bonding a substrate with electronic devices, etc., the heating temperature is preferably be 400° C. or lower, for example, about 300° C. to prevent damage to the electronic devices, etc. to significantly improve the bonding strength compared to when the substrate is not heated.

The bonding strength can be improved in either case, whether the heating temperature is increased in steps up to the target temperature or the heating temperature is increased at once up to the target temperature.

However, in the experimental example described below ($Y_2O_3$ bonding film) in which the heating temperature was 300° C., compared with heating to 300° C. by increasing the heating temperature in steps of 100° C., heating to 300° C. at once resulted in a 30% greater increase in the bonding strength $\gamma$. Therefore, heating to the target temperature at once after bonding is preferable for improving the bonding strength $\gamma$.

[Application to Hybrid Bonding]

The chemical bonding method of the present invention described above can be applied to the "hybrid bonding" described above, which is used for three-dimensional integration of multiple electronic devices.

Figure 21:
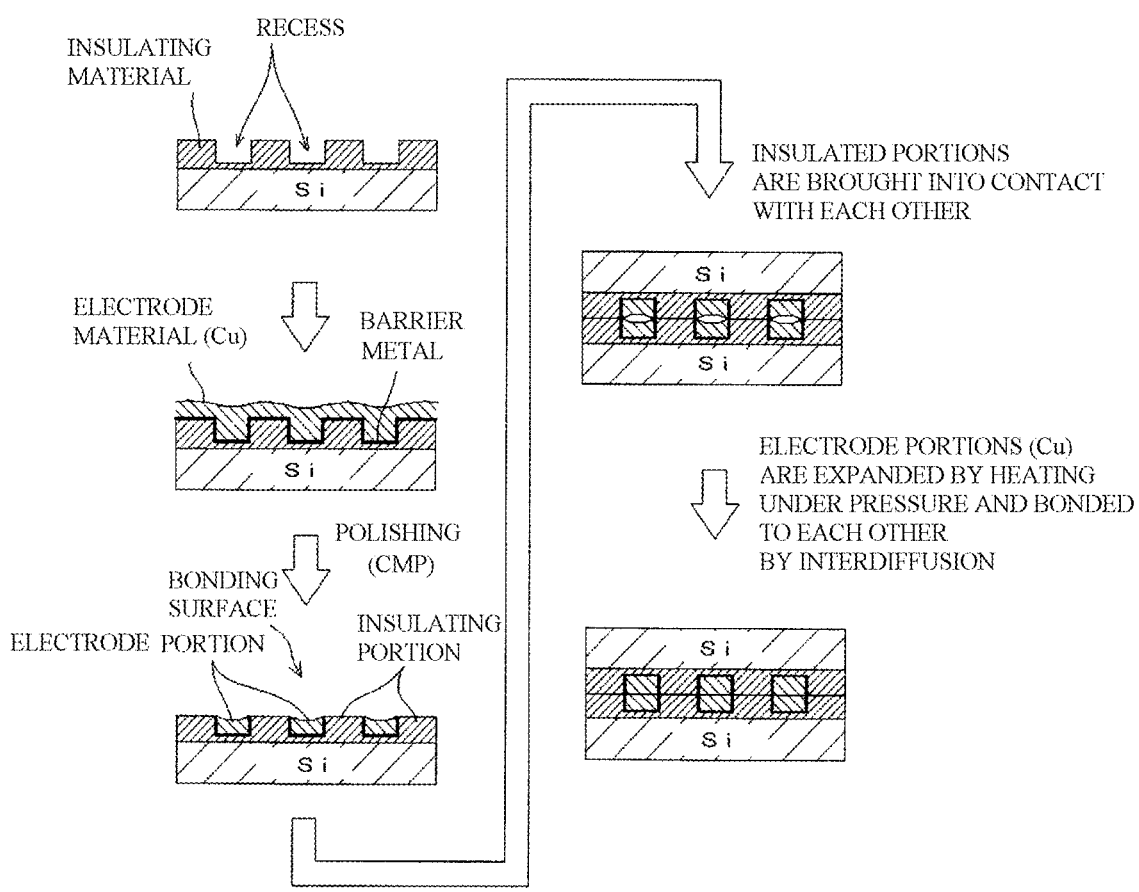
FIG. 21 illustrates hybrid bonding (related art).

The method of forming a bonding surface with an electrode portion and an insulating portion on the electronic device to be bonded may be performed as follows as described in FIG. 21: an insulating material (oxide) with a recess that serves as an electrode portion is laminated onto the device, a barrier metal and an electrode material (for example, metal such as Au or Cu) are laminated onto the insulating material, followed by CMP polishing or other processes.

The bonding surface of the electronic device to be bonded in the hybrid bonding of the present invention should be at least partially smooth. As long as the bonding surface has such a smooth surface, the entire bonding surface may be formed as a smooth surface as illustrated in FIG. 9, or the surface of the electrode portion may be depressed relative to the surface of the insulating portion, as in the case of conventional hybrid bonding described with reference to FIG. 21, or, conversely, the insulating portion may be depressed relative to the surface of the electrode portion.

Figure 9:
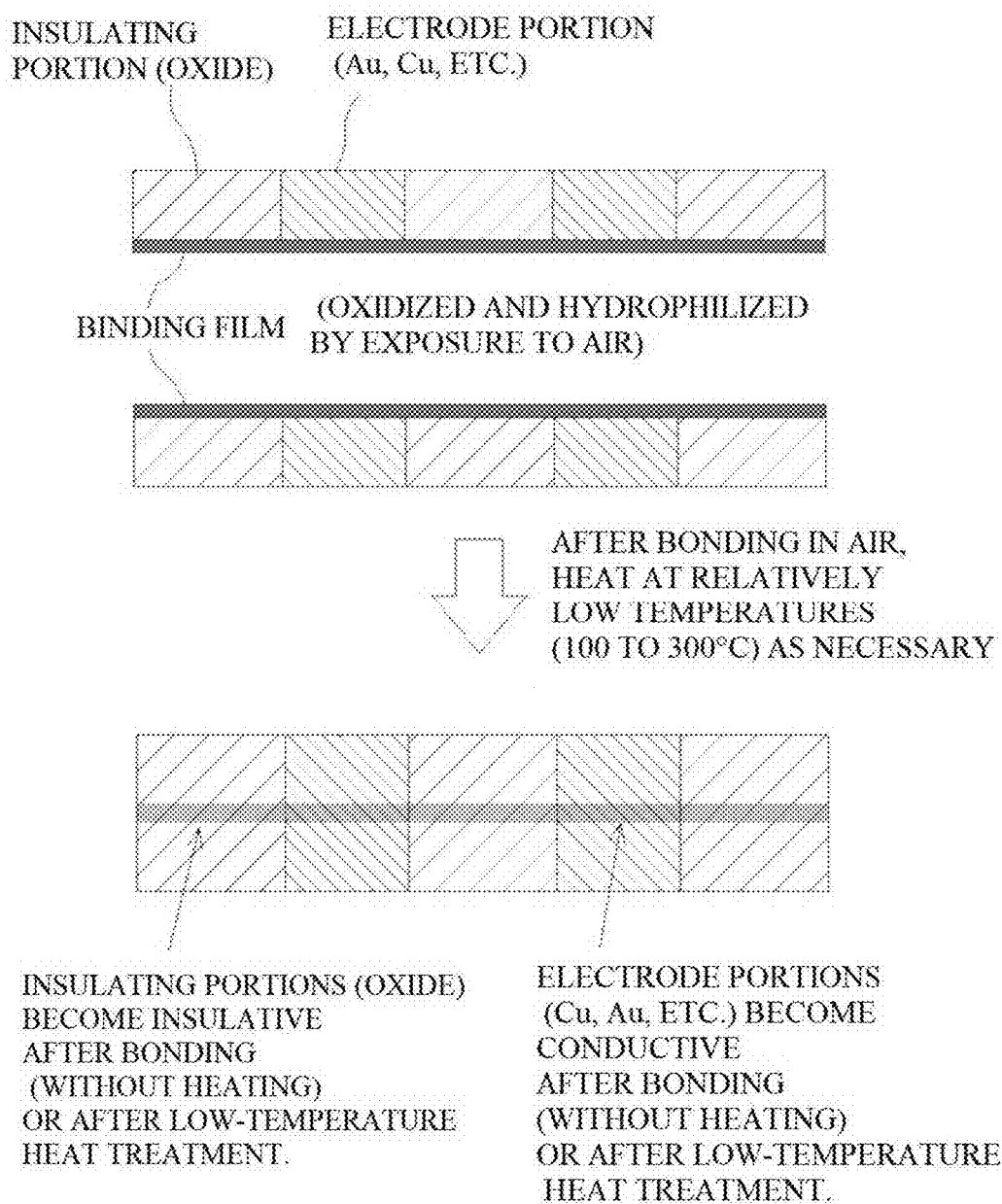
FIG. 9 illustrates hybrid bonding using the chemical bonding method of the present invention.

On each of the surfaces of the bonding surfaces, as shown in FIG. 9, a thin film of a metal or semiconductor to be a bonding film is formed by vacuum deposition, the thin film of the metal or semiconductor is exposed to air and oxidized to form a bonding film, which is an oxide film with many defects, and this bonding film is hydrophilized by moisture in air.

Then, after precisely aligning the electrode portions and insulating portions of the two bonding surfaces with each other, the bonding surfaces are overlaid with each other so that the hydrophilic bonding films (oxide films) overlap each other, thereby bonding the bonding surfaces through the bonding films is performed.

After bonding, the bonded object is heated to a predetermined temperature (for example, 100 to 300° C.) as necessary. By bonding through the bonding films in this manner, the insulating portion becomes electrically insulating without heating after bonding or after heat treatment at a low temperature, and the electrode portion (for example, Cu or Au) becomes conductive without heating after bonding or after heat treatment at a low temperature.

Conductivity may be obtained as follows: the surface of each electrode portion is formed into a dish shape with a depressed center, and the two bonding surfaces are overlaid with each other so that the insulating portions contact each other, and then heated at a predetermined temperature (for example, 100 to 300° C.) to cause the metals (such as Cu) of the electrode portions to expand thermally and make contact, thereby bringing the bonding films formed on the electrode portion surfaces into mutual contact to bond the electrode portions to each other to obtain conductivity. Furthermore, the height of one or both electrode portions may be formed higher than that of the insulating portion, and the electrode portions may be overlaid with each other so that they contact each other for bonding. That is, the structure and size of the opposing electrode portions and insulating portions are not limited as long as electrical continuity is obtained for the electrode portions to be bonded and electrical insulation is maintained for the insulating portions after bonding.

EXAMPLES

The following is a description of the results of bonding tests using the chemical bonding method of the present invention.

Experimental Example 1

Example of Bonding Using Oxide Thin Film Deposited by Sputtering Using Oxide Target as Bonding Film (1) Experimental Method Various oxide thin films were formed on smooth surfaces of base materials by sputtering using oxide targets, and these oxide thin films were used as bonding films for bonding.

The films were deposited by RF magnetron sputtering or bias sputtering under the conditions in Table 2 below.

The test results, unless otherwise noted, are the results of bonding films deposited by the RF magnetron sputtering method.

TABLE 2

| | Sputtering conditions | |
|---|---|---|
| Conditions | RF magnetron sputtering | Bias sputtering |
| Achieved degree of vacuum | $1 \times 10^{-6}$ Pa or less ($10^{-7}$ Pa level) | $1 \times 10^{-5}$ Pa or less ($10^{-6}$ Pa level) |
| Sputtering gas | Pure Ar (no oxygen added) | Pure Ar and pure Ar + oxygen |

Quartz substrates [2 inches in diameter, surface roughness Sa: 0.12 to 0.14 nm (however, only the quartz substrate used in the bias sputtering had a diameter of 4 inches and surface roughness Sa of 0.13 nm)] and Si substrates (2 inches in diameter, surface roughness Sa: 0.15 nm) were used as bonding targets (base materials). Oxide thin films were formed on these substrates by the sputtering method to form the bonding films.

The bonding films deposited by either method were vented with nitrogen gas in the load lock chamber of the sputtering equipment and then taken out to air at a humidity of 50% (room temperature: 20° C.) to hydrophilize them, and the two substrates were bonded by overlaying them with each other without pressure so that the bonding films contact each other.

Bonding was performed immediately after taking out to air.

After bonding, the free energy $\gamma$ (J/m$^2$) at the bonding interface was measured as the bonding strength by the blade method for the unheated sample and the sample heated at 100° C., 200° C., and 300° C. (and 400° C. in some test examples) for 5 minutes.

Figure 8:
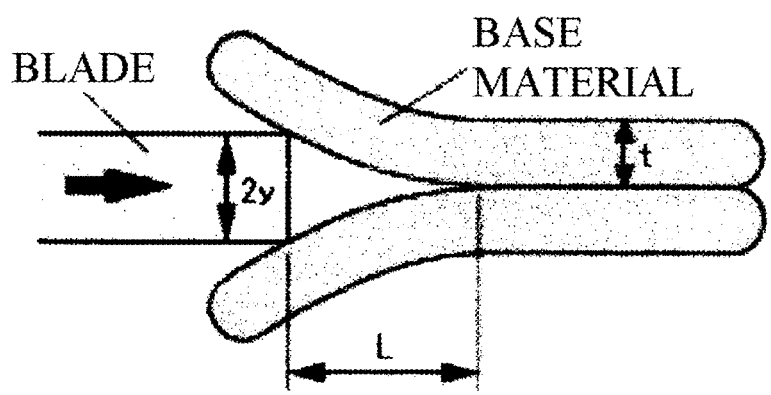
FIG. 8 illustrates the "blade method" used to measure the bonding strength (free energy at the bonding interface) γ ($J/m^2$).

Here, the blade method evaluates the bonding strength (surface free energy at the bonding interface) $\gamma$ based on the peeling length L from the tip of the blade when the blade is inserted into the bonding interface of the two base materials, as indicated in FIG. 8, and the bonding strength $\gamma$ is expressed by the following equation [M. P. Maszara. G. Goetz. A. Cavigila and J. B. McKitterick: J. Appl. Phys. 64 (1988) 4943]:

$$\gamma = 3/8 \times Et^3 y^2 / L^4$$

wherein E is the Young's modulus of the wafer, t is the thickness of the wafer, and y is ½ the thickness of the blade.

(2) Experimental Results (2-1) Bonding with Y$_2$O$_3$ Thin Films as Bonding Films Table 3 shows the measured bonding strength of Y$_2$O$_3$ thin films of 2 to 10 nm thickness on each of two quartz substrates as a bonding film.

TABLE 3

Bonding strength of wafers with Y$_2$O$_3$ thin films as bonding films

| Bonding film thickness | Bonding strength $\gamma$ (J/m$^2$) | | | |
|---|---|---|---|---|
| (nm/one side) | Unheated | 100° C. | 200° C. | 300° C. |
| 2 | 0.15 | 0.44 | 0.62 | 0.82 |
| 5 | 0.13 | 0.56 | 0.73 | 0.89 |
| 10 | 0.12 | 0.52 | 0.72 | 0.90 |

In the entire range of film thickness from 2 to 10 nm, the arithmetic mean height Sa of the Y$_2$O$_3$ thin film surfaces was about 0.14 nm or less, which was about the same as that of the quartz substrate surfaces.

The above results indicate that the bonding strength $\gamma$ (J/m$^2$) without heating was low, ranging from 0.12 to 0.15 J/m$^2$, but confirmed that the bonding could be achieved in air even without heating.

The bonding strength was not increased by pressure.

On the other hand, the change in bonding strength $\gamma$ was measured as the heating temperature of the substrate after bonding was increased in steps of 100° C. The bonding strength increased as the heating temperature increased, reaching 0.82 to 0.90 J/m$^2$ after heating to 300° C.

The test results shown in Table 3 above show the heating temperature increased in steps of 100° C., whereas Table 4 below shows the bonding strength $\gamma$ when the substrates after bonding were heated by increasing the temperature to 300° C. at once.

TABLE 4

Difference in bonding strength $\gamma$ based on differences in control conditions of heating temperature (Y$_2$O$_3$ film)

| Heating temperature control conditions | Bonding strength $\gamma$(J/m$^2$) Film thickness 5 nm/one side |
|---|---|
| Stepwise temperature increase in steps of 100° C. up to 300° C. | 0.89 (quartz substrate) |
| Temperature increased to 300° C. at once | 1.23 (quartz substrate) 1.78 (Si substrate) |

The above results confirmed that the increase in bonding strength was greater when the temperature was increased to 300° C. at once, compared to when the heating temperature was increased in steps of 100° C.

In all samples, bubble generation due to heat treatment was not observed at the bonding interface, indicating that the bonding by the chemical bonding method of the present invention can be used for bonding components that require transparency in the junction and for bonding electronic components (insulating portions) that require homogeneity in the bonding state.

FIG. 1 shows a cross-sectional TEM image of a bonded sample of Si substrates ($\gamma$=1.78 J/m$^2$) that were bonded with Y$_2$O$_3$ thin films (5 nm) as bonding films and then heated to 300° C. at once.

As shown in FIG. 1, a layer of low density exists at the bonding interface, but the bonding interface was observed to have disappeared in some places.

The Y$_2$O$_3$ thin films contained microcrystals in the interior, and the heat treatment produced atomic rearrangement areas where the bonding interface disappeared.

(2-2) Bonding Using ZrO$_2$ Thin Films as Bonding Films

Table 5 shows the results of measuring the bonding strength of ZrO$_2$ thin films of 2 to 10 nm thickness, which were formed as bonding films on the two quartz substrates.

TABLE 5

Bonding strength of substrates with ZrO$_2$ thin films as bonding films

| Bonding film thickness | Bonding strength $\gamma$ (J/m$^2$) | | | |
|---|---|---|---|---|
| (nm/one side) | Unheated | 100° C. | 200° C. | 300° C. |
| 2 | 0.14 | 0.16 | 0.22 | 0.37 |
| 5 | 0.15 | 0.16 | 0.20 | 0.57 |
| 10 | 0.17 | 0.18 | 0.18 | 0.40 |
| 20 | 0.10 | 0.10 | 0.10 | 0.10 |

For film thicknesses of 2 to 10 nm, the bonding strength $\gamma$ without heating ranged from 0.14 to 0.17 J/m$^2$, and the change in the bonding strength $\gamma$ was measured as the heating temperature was increased in steps of 100° C. As a result, the bonding strength $\gamma$ showed a tendency to increase as the heating temperature increased, and the bonding strength increased to 0.37 to 0.57 J/m² when the heating temperature was increased to 300° C.

On the other hand, for a film thickness of 20 nm (one side), the bonding strength γ without heating was 0.10 J/m², which was significantly lower than that for a film thickness of 2 to 10 nm.

For a film thickness of 20 nm (one side), no increase in the bonding strength γ was observed as the heating temperature was increased.

These results are presumably due to the fact that the arithmetic mean height Sa of the bonding film surfaces was 0.15 nm or less in the film thickness range of 2 to 10 nm, whereas the arithmetic mean height Sa of the bonding film surfaces increased to 0.22 nm for the film thickness of 20 nm.

Although the bonding strength γ was lower, it was confirmed that the substrates themselves could be bonded even when 20 nm thick $ZrO_2$ thin films were used as bonding films.

In all samples, bubble generation due to heat treatment was not observed at the bonding interface, indicating that the bonding by the chemical bonding method of the present invention can be used for bonding components that require transparency in the junction and for bonding electronic components (insulating portions) that require homogeneity in the bonding state.

(2-3) Bonding Using $TiO_2$ Thin Films as Bonding Films

Figure 2:
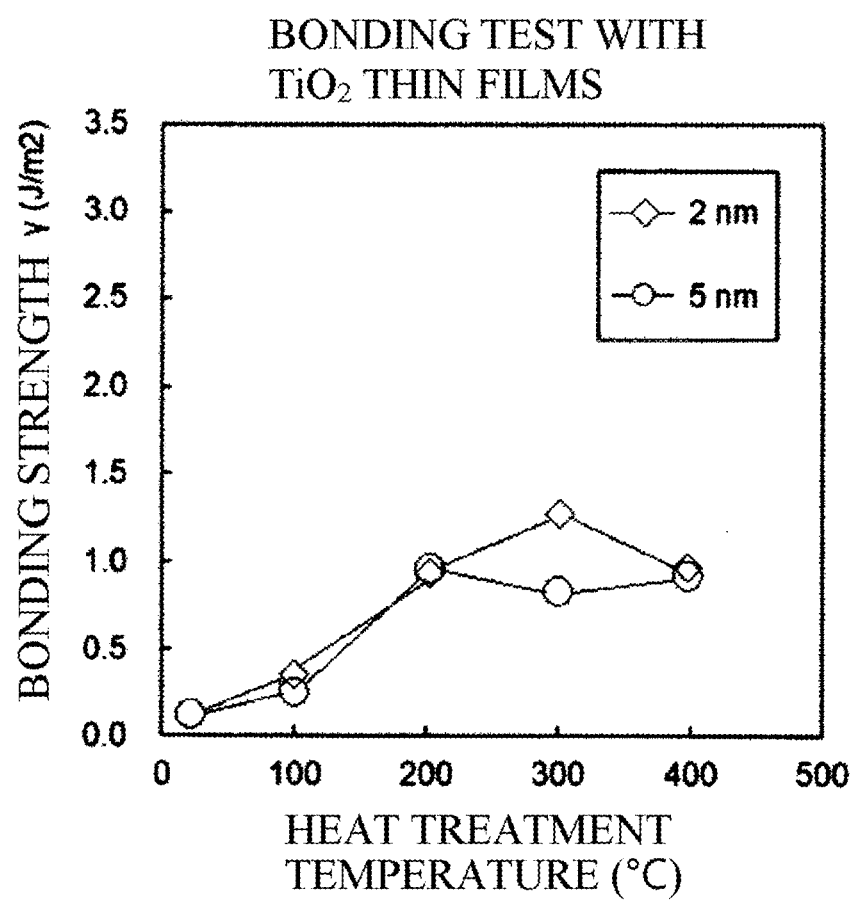
FIG. 2 illustrates the correlation between heat treatment temperature and bonding strength γ for each film thickness (2 nm and 5 nm) in the bonding test results of quartz substrates with $TiO_2$ thin films as bonding films.

FIG. 2 shows the results of measuring the bonding strength of two quartz substrates bonded by 2 nm or 5 nm thick $TiO_2$ films formed as bonding films on the two substrates.

For both the 2 nm and 5 nm thick films, the bonding strength γ without heating was 0.1 J/m², but reached 1 J/m² by heating to 200° C., and reached a plateau by further heating (up to 400° C.) without any significant change in γ.

However, it was confirmed that the substrates could be bonded under all conditions, and that heat treatment after bonding was effective in improving the bonding strength γ.

In all samples, bubble generation due to heat treatment was not confirmed at the bonding interface, indicating that the bonding by the chemical bonding method of the present invention can be used for bonding components that require transparency in the junction and for bonding electronic components (insulating portions) that require homogeneity in the bonding state.

(2-4) Bonding Using ITO Thin Films as Bonding Films

Figure 3:
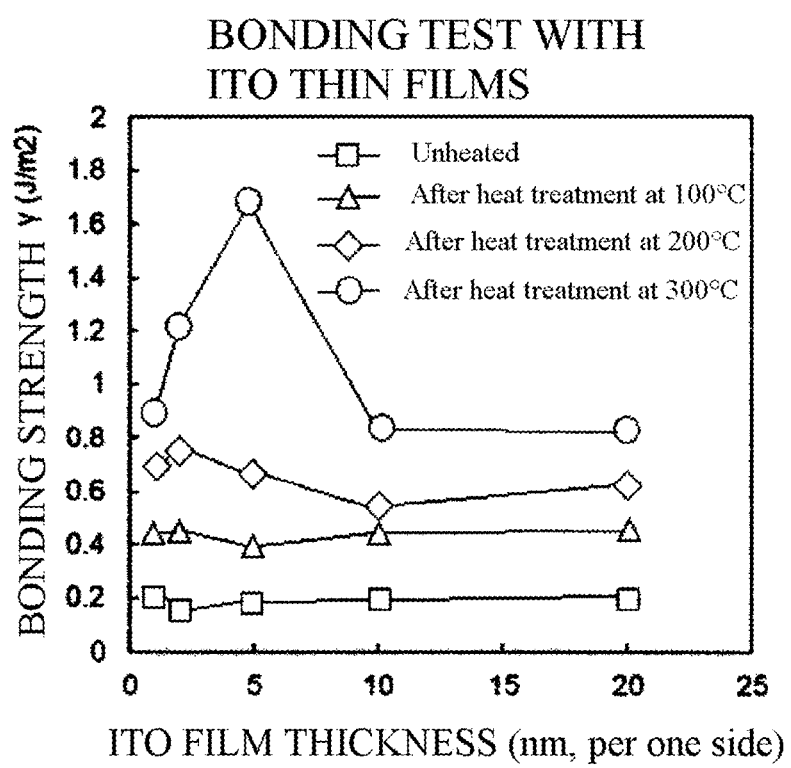
FIG. 3 illustrates the correlation between film thickness and bonding strength γ at different heating temperatures (unheated, 100° C., 200° C., and 300° C.) in the bonding test results of quartz substrates with ITO thin films as bonding films.

FIG. 3 shows the results of measuring the bonding strength of two quartz substrates bonded by 2 nm, 5 nm, 10 nm, or 20 nm thick ITO thin films formed as bonding films on the two substrates.

In the entire range of film thickness from 2 to 20 nm, the arithmetic mean height Sa of the ITO thin film surfaces was about 0.15 nm or less, all of which were comparable to the arithmetic mean height Sa of the quartz substrate surface.

The bonding strength γ without heating was 0.2 J/m², but an increase in the bonding strength γ with increasing heating temperature was observed for all film thicknesses with increasing heating temperature.

After heating to 300° C., the bonding strength γ reached 1.8 J/m² for a film thickness of 5 nm, and relatively high bonding strengths of 0.8 to 1.2 J/m² were obtained for other film thicknesses.

Figure 4:
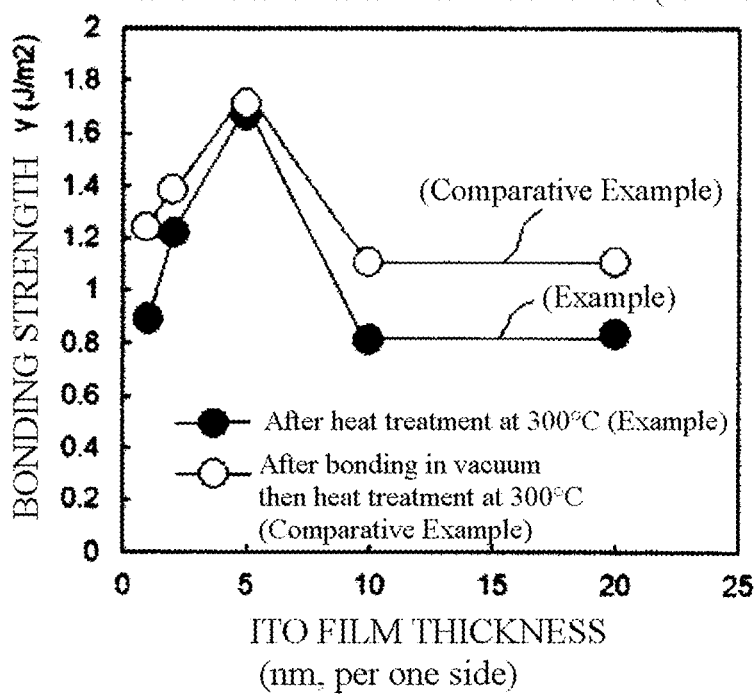
FIG. 4 illustrates the correlation between film thickness and bonding strength γ for quartz substrates bonded with ITO thin films as bonding films in air and then heated at 300° C. (Example) and for quartz substrates bonded in a vacuum vessel and then heated at 300° C. (Comparative Example), respectively.

FIG. 4 shows the bonding strength of a sample bonded in air with 5 nm thick ITO thin films as bonding films by the method of the present invention (Example) and the results of a sample bonded in a vacuum without taking out the quartz substrates, which also have 5 nm thick ITO thin films, from the vacuum vessel (Comparative Example).

As is clear from FIG. 4, in the case of the example using a 5 nm thick ITO thin film as a bonding film, the bonding strength γ of 1.7 J/m² obtained by heating to 300° C. after bonding in air was comparable to the bonding strength γ of the comparative example obtained when the sample bonded in a vacuum was heated to 300° C., indicating that bonding in air can be as strong as bonding in a vacuum, depending on the conditions.

In all samples, bubble generation due to heat treatment was not confirmed at the bonding interface, indicating that the bonding by the chemical bonding method of the present invention can be used for bonding components that require transparency in the junction and for bonding electronic components (insulating portions) that require homogeneity in the bonding state.

(2-5) Bonding Using $SiO_2$ Thin Films as Bonding Films

Figure 5:
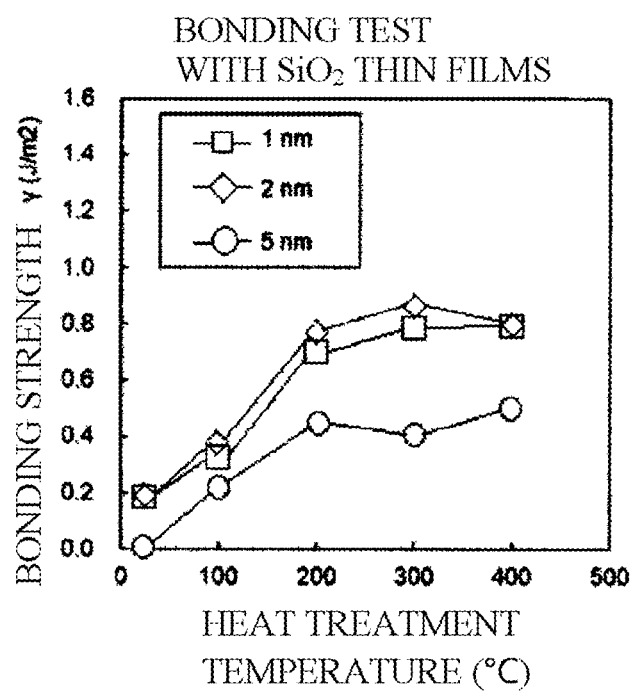
FIG. 5 illustrates the correlation between heat treatment temperature and bonding strength γ for each film thickness (1 nm, 2 nm, and 5 nm) in the bonding test results of quartz substrates with $SiO_2$ thin films as bonding films.

FIG. 5 shows the results of measuring the bonding strength γ of two quartz substrates bonded by 1 nm, 2 nm, or 5 nm thick $SiO_2$ films formed as bonding films on the two substrates.

The bonding strength γ of 1 nm and 2 nm film thicknesses was 0.17 J/m² when the films were not heated, but increased with increasing heating temperature, almost saturating at heating above 200° C. The bonding strength γ after heating to 300° C. was 0.87 J/m² (film thickness 2 nm).

In the $SiO_2$ thin film, the arithmetic mean height Sa of the surface increases rapidly with increasing the film thickness, and the bonding strength γ is lower for bonding with 5 nm thick $SiO_2$ thin films compared to the film thicknesses of 1 nm and 2 nm.

However, it was confirmed that bonding was possible in all cases where $SiO_2$ thin films of any thickness were used as bonding films.

In bonding using $SiO_2$ thin films, it was confirmed that the bonding method of the present invention, in which the substrates with $SiO_2$ thin films are taken out to air, exhibited higher bonding strength γ than that in which the substrates were bonded in a vacuum without taking out them from a vacuum vessel.

Since crystalline $SiO_2$ has a very stable diamond-type covalent bonding structure, it is presumed that amorphous $SiO_2$ has a similarly stable covalent bonding structure. Therefore, it is considered difficult to make a strong direct bond between $SiO_2$ thin films when bonding in a vacuum.

On the other hand, in the atmospheric bonding, hydrogen bonds between OH groups are generated by the moisture adsorbed to the surfaces of the $SiO_2$ films when they are taken out to air, and heat treatment from that state facilitates the formation of Si—Si and Si—O—Si bonds between the $SiO_2$ thin films, which is considered to have contributed to the increase in bonding strength γ.

In the bonding with $SiO_2$ thin films, bubble generation due to heat treatment was not observed at the bonding interface in any of the samples.

(2-6) Bonding with $WO_3$ Thin Films as Bonding Films

Figure 6:
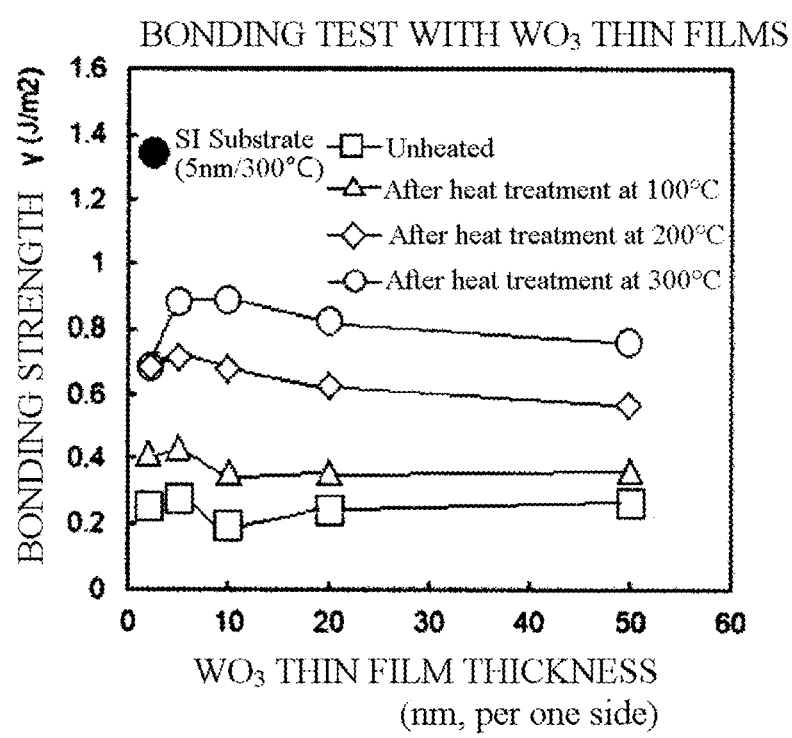
FIG. 6 illustrates the correlation between film thickness and bonding strength γ at different heating temperatures (unheated, 100° C., 200° C., and 300° C.) in the bonding test results of quartz substrates bonded with $WO_3$ thin films as bonding films.

FIG. 6 shows the results of measuring the bonding strength of two quartz substrates bonded by 2 nm, 5 nm, 10 nm, 20 nm, or 50 nm thick $WO_3$ thin films formed as bonding films on the two substrates.

In the entire range of film thickness from 2 to 50 nm, the arithmetic mean height Sa of the $WO_3$ thin film surfaces were constant at about 0.12 nm and was maintained at the same level as that of the quartz substrate surfaces.

The bonding strength γ was about 0.2 $J/m^2$ for both film thicknesses without heating, and about 0.9 $J/m^2$ at maximum after heating to 300° C. (film thicknesses of 5 and 10 nm), indicating that the dependence of bonding strength γ on film thickness is relatively small.

This is considered to be because the arithmetic mean height Sa of the surfaces of the $WO_3$ thin films remains constant even as the film thickness increases, as described above.

The plot in FIG. 6, labeled "Si substrate (5 nm/300° C.)," shows the bonding strength γ of a sample of Si substrates with 5 nm thick $WO_3$ thin films bonded in air and then heated to 300° C. at once. In this case, the bonding strength γ increased to 1.36 $J/m^2$.

The results confirm that higher bonding strength γ was obtained when Si substrates were bonded and heated to 300° C. at once than when quartz substrates were bonded.

In addition, generation of bubbles due to heat treatment was not observed at the bonding interface in any of the samples bonded using $WO_3$ thin films as bonding films.

(2-7) Comparison of Bonding Strength Between Various Bonding Films

Table 6 below shows the comparative results of bonding strength γ when quartz substrates were bonded with the aforementioned thin films of $Y_2O_3$, $ZrO_2$, $TiO_2$, ITO, $SiO_2$, and $WO_3$ as bonding films.

In Table 6, among the results of the bonding tests using each of the above bonding films, only the results for the 2 nm and 5 nm thick films, which have an arithmetic mean height Sa of 0.16 nm or less on the surface, are shown (however, only the 5 nm thick $SiO_2$ film had a slightly larger arithmetic mean height Sa of 0.22 nm).

The bonding strength γ after heating to 300° C. represents the bonding strength γ after heating to 300° C. when the temperature was increased in steps of 100° C. The bonding strength γ in parentheses is the value when the temperature was increased to 300° C. at once.

TABLE 6

Comparison of bonding strength γ between various bonding films

| | | Bonding strength γ ($J/m^2$) | |
|---|---|---|---|
| Bonding film | Film thickness | Unheated | After heating to 300° C. [Values in parentheses are for temperature rise at once] |
| $Y_2O_3$ | 2 nm | 0.15 | 0.82 |
| | 5 nm | 0.13 | 0.89 (1.23) |
| $ZrO_2$ | 2 nm | 0.14 | 0.37 |
| | 5 nm | 0.15 | 0.57 |
| $TiO_2$ | 2 nm | 0.12 | 1.31 |
| | 5 nm | 0.12 | 0.83 |
| ITO | 2 nm | 0.16 | 1.22 |
| | 5 nm | 0.16 | 1.82 |
| $SiO_2$ | 2 nm | 0.17 | 0.87 |
| | 5 nm | 0.03 | 0.40 |
| $WO_3$ | 2 nm | 0.26 | 0.67 |
| | 5 nm | 0.28 | 0.89 |

The above results confirmed that bonding was possible with any of the bonding films, although there were differences in bonding strength due to differences in the constituent elements of the bonding films.

In addition, it was confirmed that the bonding strength γ increased with heating after bonding in all the bonding films, confirming that heating after bonding was effective in increasing the bonding strength γ.

In addition, in all of the bonding films, heating to 300° C. significantly improved the bonding strength γ compared to the unheated case, and many of the bonded films showed high bonding strength γ exceeding 1 $J/m^2$.

Furthermore, from the measured bonding strength of the $Y_2O_3$ thin films (5 nm), it can be inferred that further improvement in the bonding strength γ can be achieved by changing the heating conditions for the other bonding films so that they are heated to the target temperature at once.

In the bonding cases where $TiO_2$ and $SiO_2$ thin films were used as bonding films, the heating temperature was further increased to 400° C. and the change in bonding strength γ was measured, but no further improvement in the bonding strength γ was observed. When heating after bonding was performed, it was confirmed that even heating at 400° C. or lower, for example, 300° C., which is unlikely to cause damage to electronic devices, was effective in improving the bonding strength γ.

(2-8) Presence or Absence of Bonding Film, Change in Film Thickness, and Bonding Strength γ

Table 7 below shows the bonding strength γ of two quartz ($SiO_2$) substrates polished to an arithmetic mean height Sa of 0.12 nm and bonded (optical contact) in air, the bonding strength γ of two quartz substrates, each with a $SiO_2$ film (2 nm thick) with an arithmetic mean height Sa of 0.12 nm, bonded in air, and the bonding strength of two quartz substrates, each with a 200 nm thick $SiO_2$ film formed by bias sputtering, bonded in air.

The results after heat treatment to 300° C. were measured by increasing the heating temperature in steps of 100° C. after bonding and measuring the bonding strength γ when the temperature reached 300° C.

TABLE 7

Relationship between the presence of bonding film, changes in film thickness, and bonding strength γ

| | Quartz substrate (No film) | $SiO_2$ film (2 nm thick) | $SiO_2$ film (200 nm thick) |
|---|---|---|---|
| Unheated | 0.07 $J/m^2$ | 0.17 $J/m^2$ | Pure Ar: 0.10 $J/m^2$ <br> Ar + $O_2$: 0.14 $J/m^2$ |
| After heating to 300° C. | 0.25 $J/m^2$ | 0.87 $J/m^2$ | Pure Ar: 0.42 $J/m^2$ or more (bubble generated) <br> Ar + $O_2$: Too many bubbles to analyze |

The constituent element of quartz is $SiO_2$, which is common to the $SiO_2$ thin film formed as the bonding film. The above results show that when the arithmetic mean height Sa is the same, the bonding of $SiO_2$ thin films deposited by vacuum deposition as bonding films achieve a significantly higher bonding strength γ in both the results without heating and after heating to 300° C., compared to direct bonding between quartz substrates.

The reason for this large difference in bonding strength despite the common constituent elements is that the $SiO_2$ thin film formed by vacuum deposition has more defects than the quartz substrate, and it is assumed that the presence of these defects is one of the reasons for the increase in the bonding strength.

The results in Table 7 above confirmed that when using thin films formed by a deposition method that can form a thick film without increasing the surface roughness, such as the bias sputtering method, even relatively thick films of 200 nm could be bonded together with higher bonding strength than when bonding quartz substrates (without film) by optical contact.

These results indicate that, according to the bonding method of the present invention, bonding can be performed by increasing the film thickness as long as the surface roughness of the bonding film used for bonding can be maintained within a predetermined range.

(2-9) Exposure Time of Oxide Film to Air and Bonding Strength γ

Figure 7:
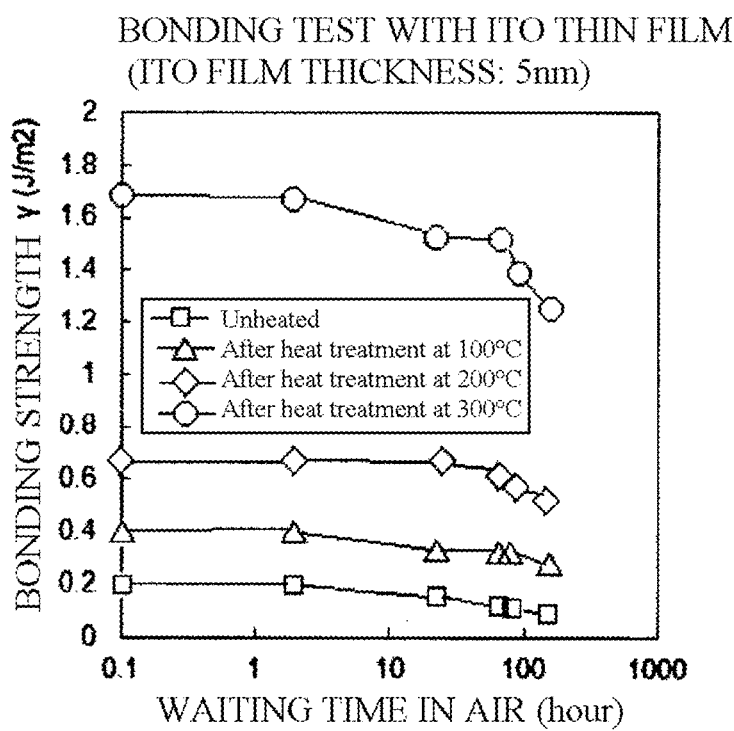
FIG. 7 illustrates the correlation between the waiting time in air and bonding strength γ in the bonding test results of quartz substrates bonded with ITO thin films as bonding films.

FIG. 7 shows the results of measuring the bonding strength by forming 5 nm thick ITO thin films as bonding films on two quartz substrates and then taking out the substrates to air, varying the waiting time before bonding. Table 8 shows the magnitude (%) of the bonding strength γ after a given waiting time relative to the bonding strength (100%) when bonded immediately after taking out.

The arithmetic mean height Sa of the 5 nm thick ITO thin film surfaces was about 0.15 nm or less, which was similar to that of the quartz substrate surfaces.

The bonding strength γ showed almost no decrease when the waiting time was 2 hours or less.

Although the bonding strength γ gradually decreased after 2 hours, it was confirmed that the bonding strength γ after 24 hours was also 91% (after heating to 300° C.) of that after bonding immediately after taking out to air, which was 74% (unheated) of that after bonding immediately after taking out to air.

Furthermore, after 165 hours (1 week), the bonding strength without heating was 40% of that immediately after taking out and 70% after heating to 300° C., but the bonding was still possible.

Thus, the hydrophilization of the bonding film caused by taking out to air is maintained for a long time (thus, bonding is possible for a long time).

However, as the surface contamination by organic molecules progresses over time, the surface is chemically stabilized and gradually turns hydrophobic, resulting in a decrease in bonding strength. Therefore, it is necessary to control the time from taking out to bonding within the range where the required bonding strength can be obtained.

In all samples, bubble generation due to heat treatment was not confirmed at the bonding interface, indicating that the bonding by the chemical bonding method of the present invention can be used for bonding components that require transparency in the junction and for bonding electronic components (insulating portions) that require homogeneity in the bonding state.

TABLE 8

Ratio of bonding strength γ to bonding strength γ when bonded immediately after taking out (%)

| | | Waiting time (hours) | | |
|---|---|---|---|---|
| | | 2 | 24 | 165 |
| Ratio of bonding strength (%) | Unheated | 99 | 74 | 39 |
| | After heating to 300° C. | 99 | 91 | 73 |

Experimental Example 2

Example of Bonding Using Metal Thin Films Oxidized in Air as Bonding Films

(1) Purpose of Test

In Experimental Example 1, in all of the bonding cases, a thin oxide thin film was formed directly on the substrate surface by sputtering using an oxide target, which was used as a bonding film.

On the other hand, in the present experimental example (Experimental Example 2), metal thin films (unoxidized) were formed on substrates by vacuum deposition, and the substrates with the metal thin films were taken out to air and oxidized afterward to obtain oxide thin films (in some samples, only the surface portion was oxidized) as bonding films, confirming that chemical bonding could be performed with this type of bonding films.

(2) Experimental Method

Various metal thin films were formed on the smooth surfaces of base materials (quartz or Si substrates) by DC magnetron sputtering using a metal target (pure Ar gas was used). These base materials with the metal thin films were taken out to air at 50% humidity (room temperature of 20° C.) and the oxide thin films obtained by oxidizing the metal thin films at room temperature with air were formed as bonding films, while the films were hydrophilized by moisture in air for bonding.

Bonding was performed immediately (within 5 minutes) after taking out the base materials from the vacuum vessel.

Three types of deposition equipment were used for deposition as shown in Table 9 below.

TABLE 9

| Deposition equipment | | |
|---|---|---|
| | Achieved degree of vacuum | Vent gas *1 |
| Equipment 1 | 1 × 10$^{-7}$ Pa or less (10$^{-8}$ Pa level) | N$_2$ |
| Equipment 2 | 1 × 10$^{-5}$ Pa or less (10$^{-6}$ Pa level) | N$_2$ |
| Equipment 3 | 1 × 10$^{-4}$ Pa or less (10$^{-5}$ Pa level) | Air |

*1 Gas to be introduced when returning the vacuum chamber to atmospheric pressure after deposition Other conditions, such as the base material (substrate) used, heat treatment conditions after bonding, and bonding strength measurement method, are the same as in the case of "the bonding example using an oxide thin film, which has been deposited by sputtering using an oxide target, as a bonding film", which was described earlier as Test Example 1.

(3) Experimental Results

(3-1) Bonding Results with Ti Thin Films Oxidized to Form Bonding Films 0.3 nm to 1.0 nm thick Ti thin films were formed on two quartz substrates by DC magnetron sputtering, then taken out to air and bonded within 5 minutes.

The bonding strength γ of the quartz substrates after bonding was measured in an unheated state, after heating to 200° C., and after heating to 300° C., respectively. The measurement results are shown in Table 10.

The substrates were heated by increasing the heating temperature in steps of 100° C. using a hot plate.

TABLE 10

Bonding strength γ of bonding in which Ti thin film is oxidized in air to form bonding film

| Film thickness (nm) | Vent gas | Bonding strength γ ($J/m^2$) Unheated | 200° C. | 300° C. | Substrate Sa (nm) | Deposition equipment |
|---|---|---|---|---|---|---|
| 0.3 | Air | 0.031 | 0.71 | 0.94 | 0.13 | Equipment 3 |
| 0.5 | Air | 0.025 | 0.86 | 0.95 | 0.13 | Equipment 3 |
| 0.3 | $N_2$ | 0.20 | 0.58 | 1.02 | | Equipment 2 |
| 0.6 | $N_2$ | 0.14 | 1.02 | 1.25 | | Equipment 2 |
| 1.0 | $N_2$ | 0.16 | 1.25 | Broken | | Equipment 2 |

Visual observation of the thin films before bonding showed that both the 0.3 nm thick and 0.5 nm thick Ti thin films were transparent, indicating that they had been oxidized by being taken out to air.

Although the transparency was advanced even in the 1 nm thick Ti thin film, but the metallic color still remained, suggesting that oxidation occurred only on the surface of the 1 nm thick Ti thin film.

Although the bonding strength γ in an unheated state after bonding showed a greater value in the case where the vacuum chamber was vented with nitrogen ($N_2$) gas, it was confirmed that bonding was possible in both samples.

It was confirmed that heat treatment after bonding increased the bonding strength γ for all the samples.

The bonding strength γ after heating was higher for the films with greater thickness, and the bonding strength γ after heating to 300° C. was as high as about 1 $J/m^2$ for the 0.3 nm thick and 0.5 nm thick films, and was so high bonding strength γ for the 1.0 nm thick film that the blade could not be inserted and the quartz substrates broke when the blade was forced to be inserted.

(3-2) Bonding Results Using Oxidized Zr Thin Film as Bonding Film 0.3 nm thick or 0.5 nm thick Zr thin films were formed on two quartz substrates by DC magnetron sputtering, and then taken out to air for bonding. The bonding results are shown in Table 11.

In all cases, bonding was performed within 5 minutes after taking out to air.

The bonding strength γ after bonding was measured in an unheated state, after heating to 200° C., and after heating to 300° C., respectively. The substrate was heated by increasing the heating temperature in steps of 100° C. using a hot plate.

TABLE 11

Bonding strength γ of bonding using Zr thin film oxidized in air as bonding film

| Film thickness (nm) | Vent gas | Bonding strength γ ($J/m^2$) Unheated | 200° C. | 300° C. | Substrate Sa (nm) | deposition equipment |
|---|---|---|---|---|---|---|
| 0.3 | $N_2$ | 0.024 | 0.48 | 0.74 | 0.13 | Equipment 1 |
| 0.5 | $N_2$ | 0.028 | 0.52 | 0.74 | 0.13 | Equipment 1 |

Visual observation of the thin films before bonding showed that both the 0.3 nm and 0.5 nm thick Zr thin films were transparent, indicating that they had been oxidized by exposure to air.

After bonding, the bonding strength γ without heating was relatively low (about 0.02 to 0.03 $J/m^2$), but it was confirmed that bonding was possible.

The bonding strength γ of both samples increased by heat treatment after bonding, and the bonding strength γ after heating to 300° C. was 0.74 $J/m^2$ for both the 0.3 nm and 0.5 nm film thicknesses, which was a significant increase compared to the unheated state.

Experimental Example 3

Example of Bonding Wafers with Different Bonding Surface Materials

(1) Purpose of Test

In Experimental Examples 1 and 2 described above, an oxide thin film or a metal film oxidized only on its surface was formed as a bonding film on each surface of the wafers to be bonded, and it was confirmed that chemical bonding was possible with such a bonding film. In Experimental Example 3, it was confirmed that chemical bonding could be achieved when bonding wafers with bonding surfaces made of different materials, as well as when bonding wafers with a bonding film on only one of the bonding surfaces.

(2) Experimental Method

A 5 nm thick ITO thin film was used as an oxide thin film to be a bonding film. The method of thin film formation is the same as in Experimental Example 1. In some experiments, a 0.5 nm thick Ti thin film was formed by a DC magnetron sputtering method and taken out to air to oxidize the surface. The thin film formation method is the same as in Experimental Example 2, and the equipment used is Equipment 1 in Table 9.

Other conditions, such as the base material (substrate) used, heat treatment conditions after bonding, and bonding strength measurement method, are the same as in the case of the bonding example using an oxide thin film deposited by the sputtering method with an oxide target as a bonding film, which was described earlier as Experimental Example 1.

(3) Experimental Results

(3-1) Bonding Results of ITO Thin Film and Oxidized Ti Thin Film

Table 12 shows the results of bonding a 5 nm thick ITO thin film on one substrate and a 0.5 nm thick Ti thin film on the other substrate, which were formed as bonding films, taken out to air almost simultaneously, and bonded within 5 minutes. In the table, the results of bonding 5 nm thick ITO thin films are also shown for comparison, which are the same as those shown in Experimental Example 1.

The bonding strength $\gamma$ of 0.35 (J/m$^2$) was obtained when an ITO film and a surface oxidized Ti film were bonded even in an unheated state, which is greater than that of bonding ITO thin films to each other. The bonding strength $\gamma$ after heating to 300° C. was 1.23 J/m$^2$, which was lower than that of ITO thin films bonded to each other, but higher than 1 J/m$^2$.

This indicates that, even when bonding oxide films of different types formed by different methods, high bonding strength can be obtained by taking out the thin films to air and hydrophilizing the surfaces after the formation of the thin films, and a higher bonding strength can be obtained by promoting chemical bonding at the bonding interface through heat treatment.

In this experiment, one ITO thin film and the other Ti thin film were formed respectively, and taken out to air almost simultaneously and bonded within 5 minutes. However, as shown in Experimental Example 1, since a large bonding strength can be obtained when the thin films are bonded within a certain time after being taken out to air, the timing of taking out the formed thin films to air may be different, and the waiting time between taking them out to air and bonding them may be different for the two thin films to be bonded.

In all samples, bubble generation due to heat treatment was not confirmed at the bonding interface, indicating that the bonding by the chemical bonding method of the present invention can be used for bonding components that require transparency in the junction and for bonding electronic components (insulating portions) that require homogeneity in the bonding state.

TABLE 12

Bonding of dissimilar thin films and bonding strength $\gamma$

| Bonding surface 1 | Bonding surface 2 | Bonding strength $\gamma$ (J/m$^2$) | | | |
|---|---|---|---|---|---|
| (Substrate: quartz) | (Substrate: quartz) | Un-heated | 100° C. | 200° C. | 300° C. |
| ITO film (5 nm) | After forming Ti (0.5 nm), the surface was exposed to air for oxidation | 0.35 | 0.48 | 0.68 | 1.23 |
| ITO film (5 nm) | ITO film (5 nm) | 0.20 | 0.40 | 0.67 | 1.68 |

(3-2) Bonding Result of Forming ITO Thin Film on One Side

Table 13 shows the results of bonding an ITO thin film of 5 nm thickness on one substrate and no film on the other substrate. The results show that the ITO thin film was bonded within 5 minutes after it was taken out from the vacuum vessel. The table also shows the results of bonding 5 nm thick ITO thin films, and the results of bonding two quartz substrates in air without forming thin films (optical contact), which are the same as those shown in Experimental Example 1.

A bonding strength $\gamma$ of 0.26 (J/m$^2$) was obtained when a 5 nm thick ITO thin film was formed on one substrate in an unheated state, and 0.41 (J/m$^2$) was obtained after heating to 300° C. Compared to direct bonding of quartz substrates (optical contact), the bonding with an ITO thin film interposed on one of the substrates as a bonding film achieved a significantly higher bonding strength $\gamma$ in both results in an unheated state and after heating to 300° C.

In an unheated state, the bonding strength $\gamma$ of the bonding with a 5 nm thick ITO thin film on one substrate was slightly higher than that of the bonding with ITO thin films on both substrates. The reason for this may be as follows: the surface roughness of the quartz substrate without ITO thin film is slightly lower than that of the ITO film, and hydrogen bonding can easily occur at the contact interface even if only one of the ITO film surfaces is in a hydrophilic state. However, the bonding strength $\gamma$ after heating to 300° C. was higher when ITO films were formed on both sides. The reason for this may be as follows: due to the large number of defects on the surface of the ITO film, bonding of atoms at the contact interface is more likely to occur during heat treatment when ITO films are formed on both sides.

Thus, even in the bonding of quartz substrates with ITO film on only one of the substrates, a higher bonding strength was obtained than in the direct bonding of quartz substrates (optical contact). In addition, as is clear from the aforementioned bonding results of oxidized ITO and Ti thin films bonding is possible regardless of the type of thin film, as long as both surfaces to be bonded are hydrophilic. From this, it is clear that even higher bonding strength can be obtained when the surfaces of quartz substrates without thin films are activated to promote hydrophilization.

TABLE 13

Formation of bonding film on one side and bonding strength $\gamma$

| Bonding surface 1 | Bonding surface 2 | Bonding strength $\gamma$ (J/m$^2$) | | | |
|---|---|---|---|---|---|
| (Substrate: quartz) | (Substrate: quartz) | Un-heated | 100° C. | 200° C. | 300° C. |
| ITO film (5 nm) | No film (Quartz substrate) | 0.26 | 0.48 | 0.41 | 0.41 |
| ITO film (5 nm) | ITO film (5 nm) | 0.20 | 0.40 | 0.67 | 1.68 |
| No film (Quartz substrate) | No film (Quartz substrate) | 0.07 | 0.07 | 0.18 | 0.25 |

Experimental Example 4

Test to Confirm Conductivity of Electrode Portions Bonded by the Chemical Bonding Method of the Present Invention

(1) Purpose of Test

The purpose is to confirm that continuity can be obtained between electrode portions bonded by the chemical bonding method of the present invention, assuming the application of the method to hybrid bonding.

(2) Experimental Method

(2-1) Making of Wafer A

Figure 10A:
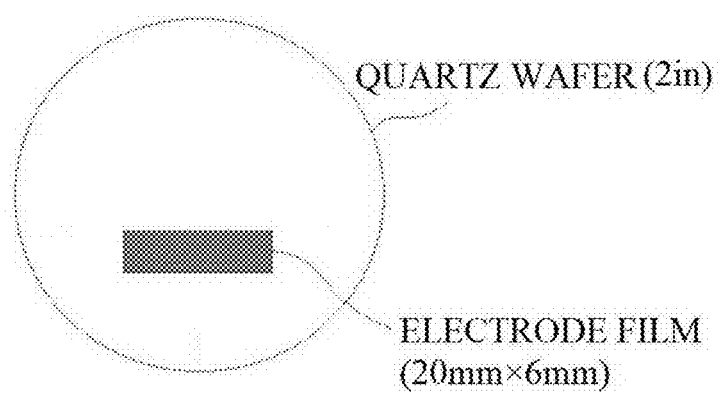
FIG. 10A illustrates the preparation process of the wafer A used in Experimental Example 4 (with an electrode film formed).

A copper (Cu) or gold (Au) electrode film (20 nm thick) was formed over a Ti base film (2 nm thick) on the gray-colored rectangle (20 mm×6 mm) in FIG. 10A of a 2-inch diameter quartz wafer.

Figure 10B:
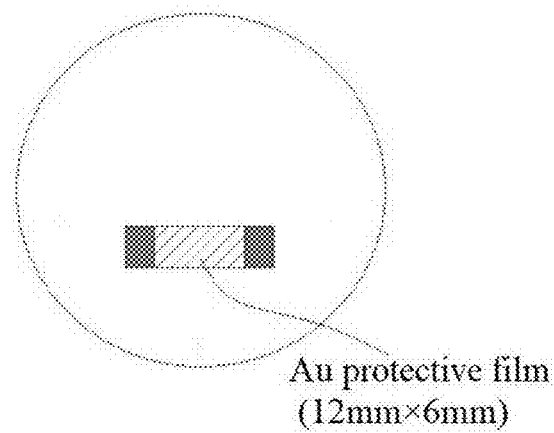
FIG. 10B illustrates the preparation process of the wafer A used in Experimental Example 4 (with an Au protective film formed on the electrode film).

A protective gold (Au) film (30 nm thick) was formed over a Ti base film (2 nm thick) in the central area (12 mm×6 mm) of the electrode film shown with hatching in FIG. 10B.

Then, a $Y_2O_3$ insulating protective film (10 nm thick) was formed in the area coinciding with the area where the gold (Au) protective film was formed (the cross-hatched area in FIG. 10C) to make a wafer A.

Figure 10C:
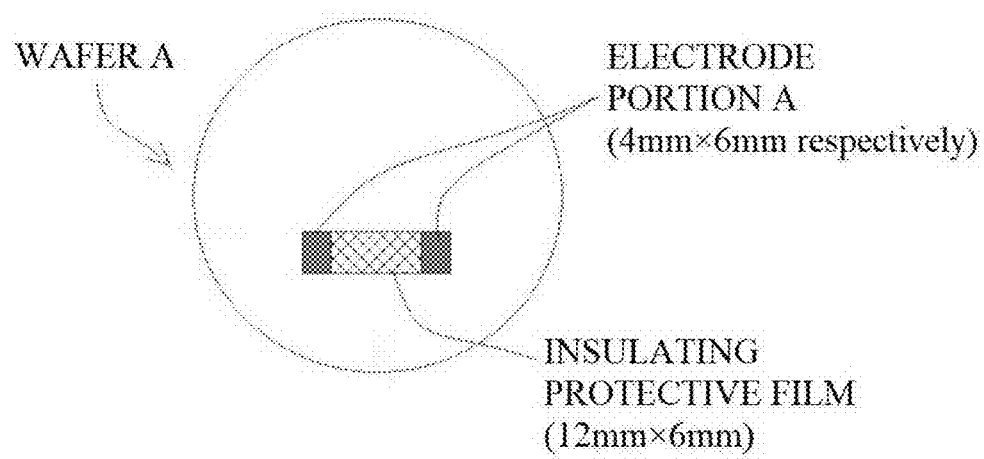
FIG. 10C illustrates the preparation process of the wafer A used in Experimental Example 4 (with an Au protective film and an insulating protective film formed on the electrode film).

The areas of wafer A that are colored gray in FIG. 10C (the areas where the electrode film is exposed) are designated as "electrode portions A".

(2-2) Making of Wafer B

Figure 11A:
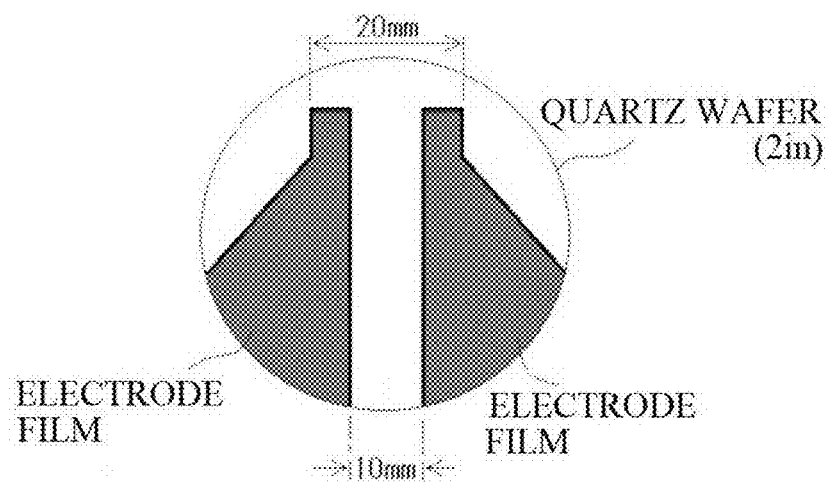
FIG. 11A illustrates the preparation process of the wafer B used in Experimental Example 4 (with an electrode film formed).

A copper (Cu) or gold (Au) electrode film (20 nm thick) was formed over a Ti base film (2 nm thick) on the gray-colored portions in FIG. 11A of a 2-inch diameter quartz wafer.

Figure 11B:
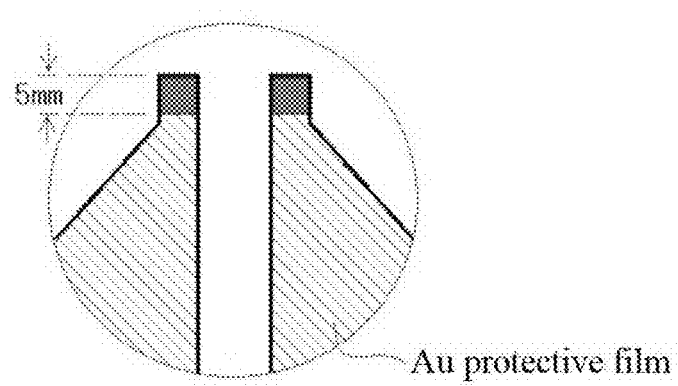
FIG. 11B illustrates the preparation process of the wafer B used in Experimental Example 4 (with an Au protective film formed on the electrode film).

A gold (Au) protective film (30 nm thick) was formed over the Ti base film (2 nm thick) in the areas of this electrode thin film, which are hatched in FIG. 11B.

Figure 11C:
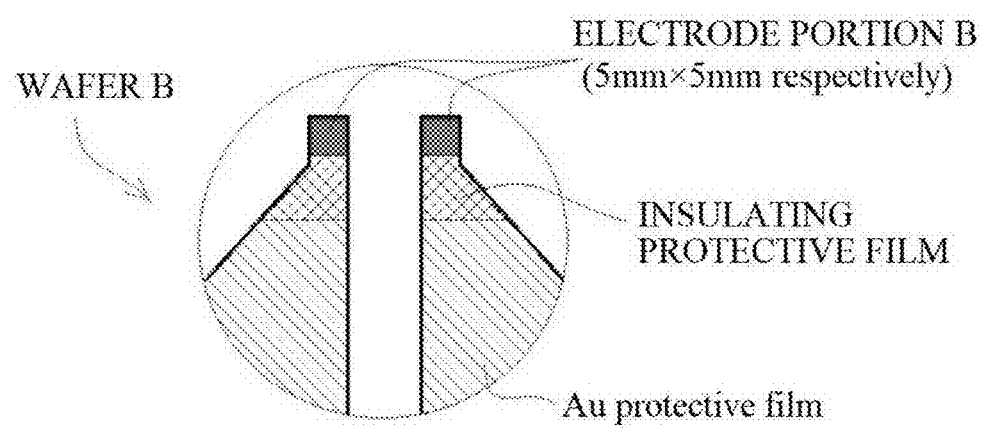
FIG. 11C illustrates the preparation process of the wafer B used in Experimental Example 4 (with an Au protective film and an insulating protective film formed on the electrode film).

Then, a $Y_2O_3$ insulating protective film (10 nm thick) was formed on the cross-hatched portions of the gold (Au) protective film in FIG. 11C to form a wafer B.

The areas of wafer C that are colored gray in FIG. 11C (the areas where the electrode thin film is exposed) are respectively designated as "electrode portions B".

(2-3) Bonding Method

After a Ti or Mn thin film was formed on the entire surfaces of wafer A and wafer B as a bonding film by vacuum deposition, both the wafer A and wafer B were taken out to air to oxidize and hydrophilize the bonding films.

Figure 12:
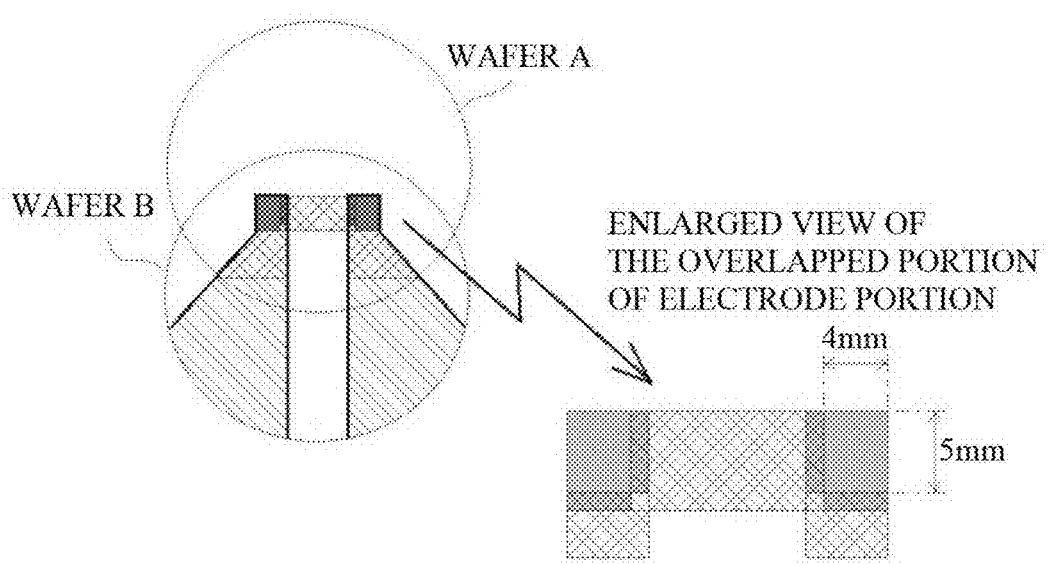
FIG. 12 illustrates the overlaying of the wafer A with the wafer B used in Experimental Example 4.

Then, the wafers A and B were overlaid with each other and bonded so that the electrode portions A on the wafer A and the electrode portions B on the wafer B overlap each other as shown in FIG. 12.

(2-4) Conductivity Evaluation

Figure 13:
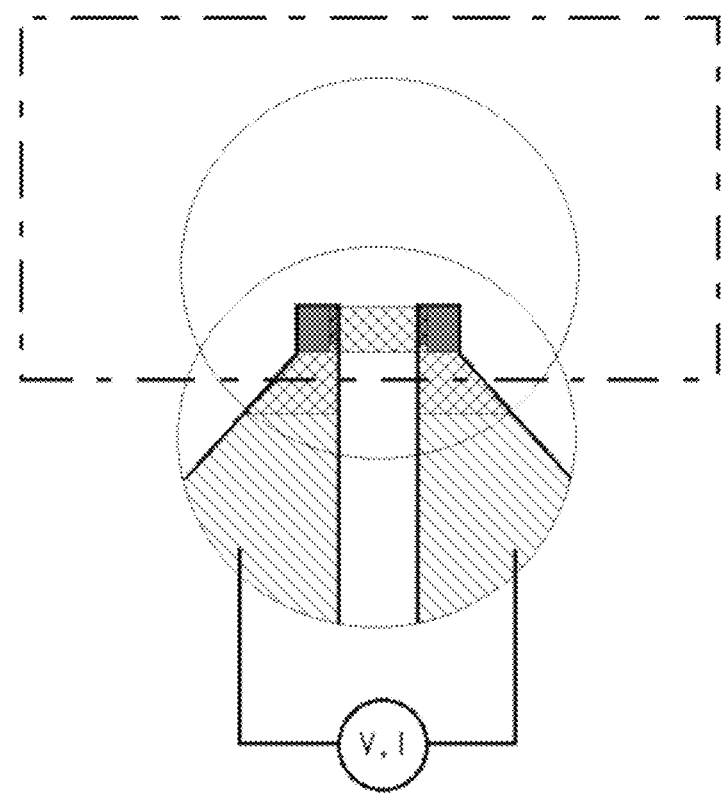
FIG. 13 illustrates the measurement circuit used in Experimental Example 4.

Using the wafers A and B bonded by the above method, the measurement circuit shown in FIG. 13 was formed.

A current was applied to this measurement circuit, and the conduction state and electrical resistance of the junction between the electrode portions A and electrode portions B, which were bonded by the chemical bonding method of the present invention, were evaluated.

(3) Experimental Results

(3-1) Bonding Between Au Electrode Portions

(3-1-1) Example

For each of the wafer A and B, a gold (Au) thin film (20 nm thick) was formed as an electrode film and a thin Ti film (0.5 nm thick) was formed as a bonding film. The bonding films were oxidized and hydrophilized by exposure to air, and then the wafers A and B were bonded at room temperature to prepare a sample.

Using the sample, the measurement circuit shown in FIG. 13 was formed. The sample was heated to 200° C. and cooled to room temperature, and the change in electrical resistance with respect to temperature change was continuously measured.

For heating, the rectangular 78 mm×58 mm area shown by the single-dotted line in FIG. 13 was clamped from above and below with a force of 25 kgf using metal with a flat surface. At this time, the electrode portions A on the wafer A and the electrode portions B on the wafer B overlapped in two areas, and a 5 mm×5 mm Teflon sheet (1.5 mm thick), slightly larger than these areas, was placed in each area and put between them. This applies a pressure of about 5 MPa to the areas where the two electrode portions overlap. In this state, heating was performed at a rate of 0.88° C./sec by gradually increasing the temperature of the electric heaters built into each of the two pieces of metal, and the temperature was held at 200° C. for 5 minutes before being allowed to cool naturally to room temperature.

(3-1-2) Comparative Example

As a comparative example, a gold (Au) electrode film, an Au protective film, and an insulating protective film were formed on each of the wafer A and wafer B by vacuum deposition, and the electrode portions A of the wafer A and the electrode portions B of the wafer B were directly bonded to each other in air to make a sample without forming bonding films on either the wafer A or wafer B, without forming bonding films.

Since Au does not oxidize in air at room temperature, atomic rearrangement occurs at the interface of Au electrodes when Au electrode films formed by vacuum deposition are overlaid with each other. Therefore, Au electrodes can be directly bonded to each other without forming a bonding film.

Using a sample of wafers bonded in this manner, the measurement circuit shown in FIG. 13 was formed. This sample was heated to 200° C. in the same manner as in the example, then cooled to room temperature and the change in electrical resistance with respect to temperature change was continuously measured.

(3-1-3) Measurement Results

Figure 14:
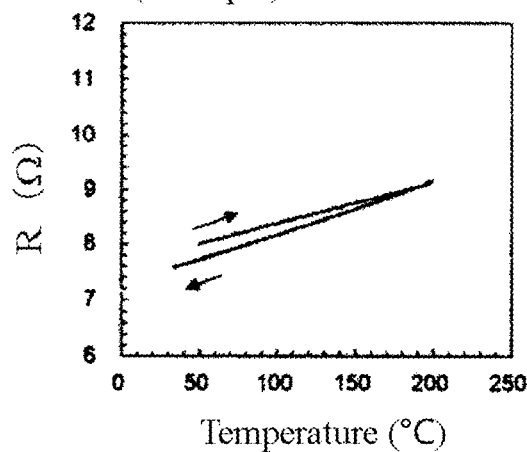
FIG. 14 illustrates the correlation between temperature change and electrical resistance change when Au electrode portions were bonded by a Ti bonding film (0.5 nm) (Example).
Figure 15:
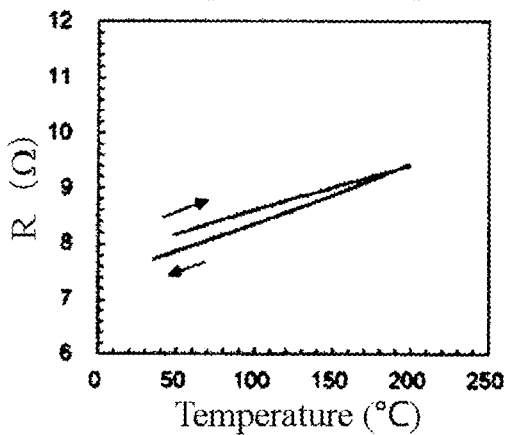
FIG. 15 illustrates the correlation between temperature change and electrical resistance change when Au electrode portions were bonded directly without a bonding film (Comparative Example).

FIGS. 14 and 15 show the measurement results of the example bonded through Ti bonding films (0.5 nm thick) and directly bonded without a bonding film, respectively, and Table 14 shows the electrical resistance of the samples before and after heating.

TABLE 14

Electrical resistance of junction of Au electrodes

|  |  | Electrical resistance (Ω) | |
|---|---|---|---|
|  | Bonding film | Before heating | After heating (200° C.) |
| Example | Ti (0.5 nm) | 8.2 | 7.9 |
| Comparative Example | None (direct bonding of Au) | 8.0 | 7.7 |

(3-1-4) Consideration

From the above results, there was no significant difference in the measured electrical resistance between the bonding through Ti bonding films and direct bonding of Au electrodes to each other.

In the sample of the comparative example, where Au electrodes were bonded to each other without intervening bonding films, the interface resistance of the bonding surfaces was approximately zero. Therefore, the above measurement results indicate that the interface resistance between the Au electrodes is approximately zero even in the sample of the example bonded with an intervening Ti bonding film (0.5 nm).

It is inferred that these results are due to the fact that the Ti bonding film was as thin as 0.5 nm, and the presence of the bonding film did not suppress the rearrangement of atoms at the Au/Au interface, resulting in atomic rearrangement beyond the bonding interface.

(3-2) Bonding of Cu Electrodes (Bonding Using 0.3 nm Thick Bonding Films)

(3-2-1) Example

A thin film of copper (Cu) (20 nm thick) as an electrode film and a bonding film were formed on each of the wafer A and wafer B. The bonding films were oxidized and hydrophilized by exposure to air, thereby bonding the wafer A and wafer B at room temperature to make a sample.

Using the sample, the measurement circuit shown in FIG. 13 was formed. The sample was heated to 200° C., cooled to room temperature, and the change in electrical resistance with respect to temperature change was continuously measured.

A Ti thin film (0.3 nm thick) or Mn thin film (0.3 nm thick) was formed as a bonding film on each of the surfaces of the wafer A and wafer B, and the wafers were bonded to make samples.

(3-2-2) Comparative Example

As a comparative example, a copper (Cu) electrode film, an Au protective film, and an insulating protective film were formed on each of the wafer A and wafer B by vacuum deposition, and the electrode portions A of the wafer A and the electrode portions B of the wafer B were directly bonded in air to make a sample without forming a bonding film on either the wafer A or wafer B.

By bonding in air, a Cu oxide film with a thickness of several nm is formed on the surface of the Cu electrode, resulting in a very low bonding strength in an unheated state, but by raising the temperature to 200° C. after bonding, the Cu oxide film disappears and a strong bonding can be obtained.

The sample was used to form a measurement circuit similar to that shown in FIG. 13. The sample was heated to 200° C., cooled to room temperature, and the change in electrical resistance with respect to temperature change was continuously measured.

(3-2-3) Measurement Results

Figure 16:
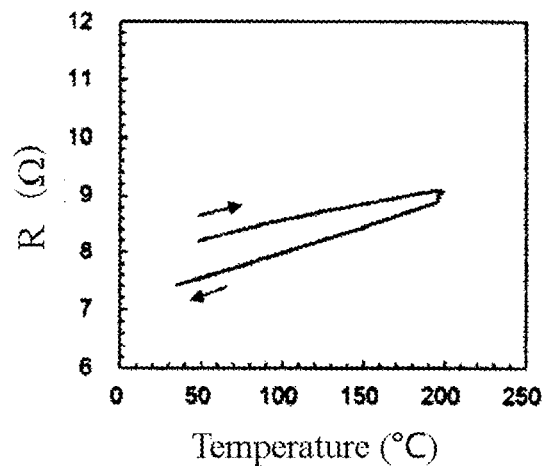
FIG. 16 illustrates the correlation between temperature change and electrical resistance change when Cu electrode portions were bonded by a Ti bonding film (0.3 nm) (Example).
Figure 17:
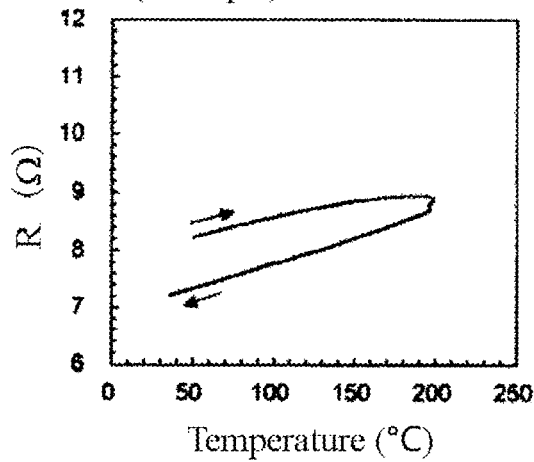
FIG. 17 illustrates the correlation between temperature change and electrical resistance change when Cu electrode portions were bonded by a Mn bonding film (0.3 nm) (Example).
Figure 18:
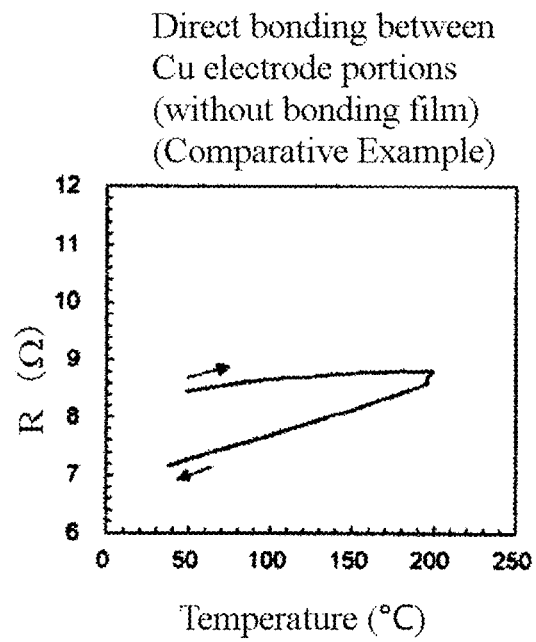
FIG. 18 illustrates the correlation between temperature change and electrical resistance change when Cu electrode portions were bonded directly without a bonding film (Comparative Example).

FIG. 16 shows the measurement results of the example bonded through a Ti bonding film (0.3 nm), FIG. 17 shows the measurement results of the example bonded through a Mn bonding film (0.3 nm), and FIG. 18 shows the measurement results of the comparative example bonded directly without a bonding film. Table 15 shows the electrical resistance of each sample before and after heating.

TABLE 15

Electrical resistance of junction at Cu electrode (bonding film thickness 0.3 nm)

| | | Electrical resistance (Ω) | |
|---|---|---|---|
| | Bonding film | Before heating | After heating (200° C.) |
| Example | Mn (0.3 nm) | 8.2 | 7.3 |
| | Ti (0.3 nm) | 8.2 | 7.6 |
| Comparative Example | None (direct bonding of Cu) | 8.5 | 7.3 |

(3-2-4) Consideration

From the above results, in the state before heating, the resistance of the sample of the example bonded through the Mn and Ti bonding films was lower than that of the sample of the comparative example in which Cu electrodes were bonded directly.

After heating to 200° C., the resistance values of all the samples of the example, in which bonding was performed through Mn or Ti bonding films, were almost the same as those in the comparative example, in which the Cu electrodes were directly bonded to each other, confirming that the inclusion of the bonding films do not increase the interface resistance at the junction of the Cu electrodes.

(3-3) Bonding of Cu Electrode (Bonding Using a 0.5 nm-Thick Bonding Film)

(3-3-1) Example

A thin film of copper (Cu) (20 nm thick) was formed as an electrode thin film on each of wafer A and wafer B, and a bonding film was formed on each of them. The bonding films were oxidized and hydrophilized by exposure to air, and the wafer A and wafer B were bonded at room temperature to make a sample.

Using the sample, the measurement circuit illustrated in FIG. 13 was formed. The sample was heated to 200° C., cooled to room temperature, and then reheated to 300° C. The change in electrical resistance with respect to temperature change was continuously measured.

A Ti thin film (0.5 nm thick) or Mn thin film (0.5 nm thick) as a bonding film was formed on each of the surfaces of wafer A and B.

(3-3-2) Comparative Example

As a comparative example, a copper (Cu) electrode thin film, an Au protective film, and an insulating protective film were formed on each of the wafer A and wafer B by vacuum deposition, and the electrode portions A of the wafer A and the electrode portions B of the wafer B were directly bonded in air to make a sample without forming a bonding film on either the wafer A or wafer B.

Using the sample, a measurement circuit similar to that illustrated in FIG. 13 was formed. The sample was heated to 200° C., and the change in electrical resistance with respect to temperature change was continuously measured.

(3-3-3) Measurement Results

Figure 19:
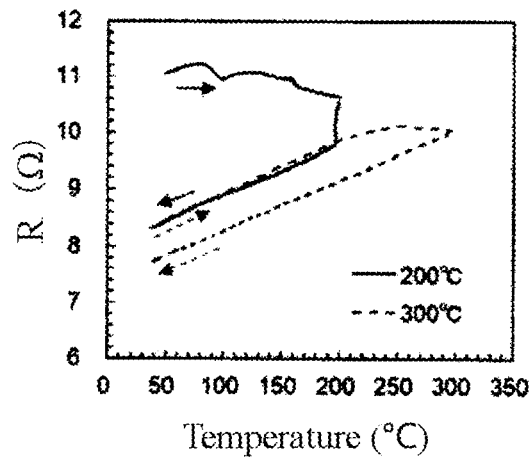
FIG. 19 illustrates the correlation between temperature change and electrical resistance change when Cu electrode portions were bonded by a Ti bonding film (0.5 nm) (Example).
Figure 20:
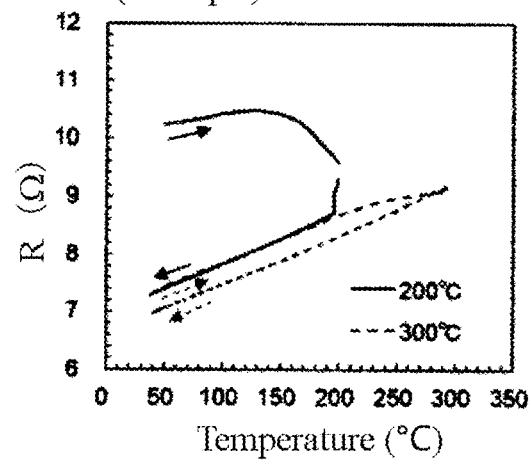
FIG. 20 illustrates the correlation between temperature change and electrical resistance change when Cu electrode portions were bonded by a Mn bonding film (0.5 nm) (Example).

FIG. 19 shows the measurement results of the example bonded through a Ti bonding film (0.5 nm thick), FIG. 20 shows the measurement results of the example bonded through a Mn bonding film (0.5 nm thick), FIG. 18 shows the measurement results of the comparative example (no bonding film), and Table 16 shows the electrical resistance of each sample before and after heating.

TABLE 16

Electrical resistance of junction at Cu electrodes
(bonding film thickness 0.5 nm)

| | | Electrical resistance (Ω) | | |
|---|---|---|---|---|
| | | Before | After heating | |
| | Bonding film | heating | 200° C. | 300° C. |
| Example | Mn (0.5 nm) | 10.2 [+0.17] | 7.4 [+0.01] | 7.1 [−0.06] |
| | Ti (0.5 nm) | 11.1 [+0.26] | 8.4 [+0.11] | 7.8 [+0.01] |
| Comparative Example | None (direct bonding of Cu) | 8.5 | 7.3 | 7.7 |

The values in [ ] indicate the interfacial resistance ΔR (Ω cm$^2$) of the junction obtained by comparison with the comparative example (no bonding film).

(3-3-4) Consideration

In the sample of the example bonded through a bonding film, the interface resistance in the bonding region was larger than that of the sample in which the Cu electrodes were directly bonded without the bonding film in an unheated state.

However, in both of the samples of the example bonded using either Mn or Ti bonding films (0.5 nm), the interfacial resistance was markedly decreased by heating to 200° C., and further decreased by heating to 300° C.

In particular, when the bonding film was Mn (0.5 nm), the resistance dropped to the same level as that in Comparison Example where the Cu electrodes were directly bonded to each other after heating to 200° C. After heating to 300° C., it was confirmed that the resistance was lower than that of the comparative example where Cu electrodes were directly bonded to each other.

Even when the bonding film is Ti (0.5 nm), it was confirmed that heating up to 300° C. lowered the resistance to the same level as that of the comparative example where the Cu electrodes were directly bonded to each other.

Therefore, it was confirmed that when the chemical bonding method of the present invention was used for hybrid bonding, good conductivity of the electrode portions was ensured by heating at a relatively low temperature of 300° C. or lower as necessary.

Experimental Example 5

Evaluation Test of Bonding Strength of Electrode Portion

(1) Purpose of Experiment

The purpose is to confirm that the required bonding strength can be obtained at the electrode portions when the chemical bonding method of the present invention is applied to hybrid bonding.

(2) Experimental Method

An electrode film made of Au or Cu (both 20 nm thick) was formed as the electrode portion through a Ti base film (2 nm thick) on each quartz substrate (2 inch diameter, surface roughness Sa: 0.10 to 0.13 nm) by sputtering using "Equipment 3" in Table 9, and an additional Ti or Mn bonding film was also formed on the electrode film.

The quartz substrates were oxidized by venting with air in the load lock chamber of the sputtering equipment, and then taken out to air at 50% humidity (room temperature of 20° C.) to hydrophilize the bonding films, and the two substrates were bonded by overlaying them so that the bonding films contact each other.

A sample in which the electrode films were directly bonded to each other without the formation of a bonding film was also prepared for comparison.

After bonding, the bonding strength (free energy at the bonding interface) γ (J/m$^2$) was measured by the blade method without heating, after heating to 200° C., and after heating to 300° C.

(3) Experimental Results

The measurement results of the bonding strength γ (J/m$^2$) are shown in Table 17.

TABLE 17

Bonding strength of electrode membrane

| Electrode | Bonding film | | Bonding strength γ (J/m$^2$) | | | Quartz | Vent | |
|---|---|---|---|---|---|---|---|---|
| Thin film | Material | Film thickness on one side (nm) | Unheated | 200° C. | 300° C. | Sa (nm) | gas | Remarks |
| Au (20 nm) | None | | | Broken | Broken | Broken | 0.12 | Air | Equipment 3 |
| | Ti | 0.3 | 0.22 | 0.29 | 1.56 | 0.12 | Air | Equipment 3 |
| | Mn | 0.3 | 0.15 | 0.31 | 1.39 | 0.13 | Air | Equipment 3 |
| | Ti | 0.5 | 0.23 | 0.23 | 1.74 | 0.12 | Air | Equipment 3 |
| | Mn | 0.5 | 0.15 | 0.39 | 1.39 | 0.13 | Air | Equipment 3 |
| Cu (20 nm) | None | | 0.39 | Broken | Broken | 0.12 | Air | Equipment 3 |
| | Mn | 0.3 | 0.22 | 0.37 | 4.66 | 0.13 | Air | Equipment 3 |
| | Ti | 0.5 | 0.12 | 0.61 | 6.92 | 0.10 | Air | Equipment 3 |

(4) Discussion

It was confirmed that a certain level of bonding strength was obtained, although the bonding strength was lower when the electrode films (electrode portions) were bonded through bonding films compared to when they were bonded directly to each other without bonding films ("None" in Table 17).

In particular, heating after bonding has been confirmed to significantly improve bonding strength γ (J/m²), even when bonded through bonding films.

Therefore, it was confirmed that the chemical bonding method of the present invention, when applied to hybrid bonding, can be used to bond electrode portions with the required bonding strength in an unheated state or by heating at 300° C. or lower as necessary.

Experimental Example 6

Evaluation Test of Insulation of Insulating Portion (1) Purpose of Experiment

The purpose is to confirm that the chemical bonding method of the present invention can be applied to hybrid bonding to obtain insulation in the insulating portion.

(2) Experimental Method

Ti or Mn bonding films were formed on quartz substrates (2 inches in diameter, surface roughness Sa: 0.12 to 0.13 nm), which are the insulating materials (insulating portions), by sputtering method using the equipment listed in Table 9.

The quartz substrates were vented in the load lock chamber of the sputtering equipment, and then taken out to air at 50% humidity (room temperature of 20° C.) to hydrophilize the bonding film, and the two substrates were bonded by overlaying them so that the bonding films contact each other.

After bonding, the sheet resistance of the bonding films was measured by the eddy current method in an unheated state, after heating to 200° C. and 300° C., respectively, by induction.

(3) Experimental Results

Table 18 shows the sheet resistance of the cases where oxidized Ti or Mn thin films were used as bonding films.

After bonding, both in an unheated state and after heat treatment, the electrical resistance was so high that it could not be measured by the eddy current method. The measurement limit of the eddy current method used in the experiment is 10 kΩ/sq, and very high electrical resistance exceeding this limit was obtained without heating.

As a result of the above, it was confirmed that high insulation properties were obtained on the bonding surface of the bonding film.

Therefore, even when the chemical bonding method of the present invention was applied to hybrid bonding, there was no short circuit between adjacent electrode portions that were separated by an insulating portion due to the presence of the bonding film. In this respect, it was confirmed that the chemical bonding method of the present invention can be used for hybrid bonding.

Experimental Example 7

Evaluation Test of Bonding Strength of Insulating Portion (1) Purpose of Experiment The purpose is to confirm that the required bonding strength can be obtained in the insulating portions when the chemical bonding method of the present invention is applied to hybrid bonding.

(2) Experimental Method

Ti or Mn bonding films were formed on quartz substrates (2 inches in diameter, surface roughness Sa: 0.12 to 0.13 nm), which are the insulating materials (insulating portions), by sputtering method using the equipment listed in Table 9.

The quartz substrates were vented in the load lock chamber of the sputtering equipment, and then taken out to air at

TABLE 18

Sheet resistance between insulating portions by bonding films of oxidized Ti or Mn thin films

| Bonding film | Film thickness on one side (nm) | Vent gas | Sheet resistance (kΩ/sq) | | | Quartz Sa (nm) | Remarks |
| --- | --- | --- | --- | --- | --- | --- | --- |
| | | | Unheated | 200° C. | 300° C. | | |
| Mn | 0.3 | Air | Measurement limit or more | Measurement limit or more | Measurement limit or more | 0.13 | Equipment 3 |
| Mn | 0.5 | Air | Measurement limit or more | Measurement limit or more | Measurement limit or more | 0.13 | Equipment 3 |
| Ti | 0.3 | Air | Measurement limit or more | Measurement limit or more | Measurement limit or more | 0.13 | Equipment 3 |
| Ti | 0.5 | Air | Measurement limit or more | Measurement limit or more | Measurement limit or more | 0.13 | Equipment 3 |

(4) Discussion

Visual observation of the thin films before bonding showed that the 0.3 nm and 0.5 nm thick Mn thin films and the 0.3 nm and 0.5 nm thick Ti thin films were both transparent, indicating that they had been oxidized by being exposed to air.

50% humidity (room temperature of 20° C.) to hydrophilize the bonding film, and the two substrates were bonded by overlaying them so that the bonding films contact each other.

After bonding, the bonding strength (free energy at the bonding interface) γ (J/m²) was measured by the blade method without heating, after heating to 200° C., and after heating to 300° C.

(3) Experimental Results

Table 10 shows the bonding strength when oxidized Ti thin films were used as bonding films.

Table 19 below shows the bonding strength when oxidized Mn thin films were used as bonding films.

TABLE 19

Bonding strength between insulating portions through oxidized Mn thin films as bonding films

| Bonding film | Film thickness on one side (nm) | Vent gas | Bonding strength γ (J/m²) | | | Quartz Sa (nm) | Remarks |
| --- | --- | --- | --- | --- | --- | --- | --- |
| | | | Unheated | 200° C. | 300° C. | | |
| Mn | 0.3 | Air | 0.33 | 0.71 | 0.94 | 0.13 | Equipment 3 |
| Mn | 0.5 | Air | 0.31 | 0.85 | 1.27 | 0.12 | Equipment 3 |

(4) Discussion

Visual observation of the thin films before bonding confirmed that both the 0.3 nm thick and 0.5 nm thick Mn thin films were transparent, indicating that they had been oxidized by being taken to air.

After bonding, the bonding strength γ without heating showed relatively low values, but it was confirmed that bonding was possible in all samples.

It was confirmed that heat treatment after bonding increased the bonding strength γ for all the samples.

Therefore, it was confirmed that the chemical bonding method of the present invention, when applied to hybrid bonding, can bond insulating portions with the required bonding strength without heating or, as necessary, with heating at 300° C. or lower.

Experimental Example 8

Evaluation Test of Bonding Strength of Insulating Portions and Electrode Portions (2)

(1) Purpose of Experiment

The objective is to confirm that the required bonding strength can be obtained when the chemical bonding method of the present invention is applied to hybrid bonding, even when the bonding films are brought into contact with each other while being heated to a predetermined temperature.

(2) Experimental Method

The sputtering method using the equipment in Table 9 was used.

In the experiment on the bonding strength of the insulating portions, a 0.5 nm thick Ti bonding film was formed on quartz substrates (2 inches in diameter, surface roughness Sa: 0.12 to 0.13 nm), which are insulating materials (insulating portions).

In the experiment on the bonding strength of the electrode portions, a 20 nm thick Au electrode film was formed on a quartz substrate (diameter 2 inches, surface roughness Sa: 0.12 to 0.13 nm) through a Ti base film (2 nm thick), and a 0.5 nm thick Ti bonding film was further formed on the electrode film.

The quartz substrate was vented in the load lock chamber of the sputtering equipment, and then taken out to air at 50% humidity (room temperature 20° C.) to hydrophilize the bonding film.

The two quartz substrates were then heated to 200° C. and 300° C., respectively, and bonded by overlaying them so that the bonding films contact each other.

The bonding strength (free energy at the bonding interface) γ (J/m²) of the samples bonded by overlaying them in such a heated state was measured by the blade method.

(3) Experimental Results

The bonding strengths obtained from the experiments are shown in Table 20 below.

TABLE 20

Bonding strength between insulating portions and between electrode portions when bonding films obtained by oxidizing Ti thin films are overlaid with each other after heating

| | Bonding film | Film thickness on one side (nm) | Vent gas | Bonding strength γ (J/m²) | | Quartz Sa (nm) | Remarks |
| --- | --- | --- | --- | --- | --- | --- | --- |
| | | | | 200° C. | 300° C. | | |
| Insulating portion | Ti | 0.5 | $N_2$ | 0.64 | 0.70 | 0.13 | Equipment 1 |
| Electrode portion | Ti | 0.5 | $N_2$ | 0.53 | 0.11 | 0.13 | Equipment 1 |

(4) Discussion

In the bonding experiments between insulating portions, visual observation of the thin films before bonding showed that the Ti films had become transparent and had been oxidized by being taken out to air. When the two substrates were heated to 200° C. and 300° C. and bonded by overlaying them so that the bonding films were in contact with each other, good bonding strength was obtained (however, it was slightly lower than the result of bonding them at room temperature in Table 10, followed by heating to the respective temperatures).

In the bonding experiment between electrode portions, two substrates heated to 200° C. were bonded by overlaying them with each other so that the bonding films were in contact with each other. The resultant bonding strength was higher than that obtained by bonding them at room temperature in Table 17, followed by heating to 200° C. When overlaying was performed after heating to 300° C., the bonding strength decreased, but it was confirmed that the bonding was possible.

In the bonding experiments between electrode portions, the reason for the lower bonding strength when the electrode portions were overlaid with each other after heating to 300° C. was that the Ti base film (2 nm thick) under the 20 nm thick Au film used as the electrode film diffused due to the heating to 300° C. and the structure of the thin film changed. Therefore, the bonding strength of the electrode portions overlaid with each other after heating to 300° C. is expected to further increase by changing the base film to a material other than Ti.

In hybrid bonding, the surfaces of the electrode portions may be brought into contact with each other by expanding the metal of the electrode portions through heating, as described with reference to FIG. 21. When the chemical bonding method of the present invention is applied to such hybrid bonding, the bonding films formed on the surfaces of the electrode portions are overlaid with each other under heating.

The present test example simulates the overlaying of bonding films under such heating conditions. As a result of the test, it was confirmed that bonding was possible even when the bonding films were overlaid with each other at elevated temperatures, and the bonding strength γ increased as the temperature was increased for both samples.

Therefore, it was confirmed that the chemical bonding method of the present invention, when applied to hybrid bonding in which contact is made between electrode portions or between insulating portions under heating, as in the bonding method described with reference to FIG. 21, can bond insulating portions and electrode portions with the required bonding strength, even when the bonding films are overlaid with each other after heating to 200° C. and 300° C.

The results in Tables 10 and 17 confirm that the insulating portions and the electrode portions can be bonded to each other with the necessary bonding strength, even when they are bonded without heating.

These results confirm that the chemical bonding method of the present invention is applicable to all hybrid bonding processes in which overlaying is performed without heating or after heating to 300° C. or lower, and that the bonding strength between insulating portions and between electrode portions can be maintained at the required strength under any temperature conditions.

What is claimed is:

1. A chemical bonding method comprising:
    a step of forming a bonding film, which is a thin film of a metal or semiconductor formed by vacuum deposition involving rapid cooling of raw material atoms on base materials, and having many defects and hydrophilicity, and oxidized at least on its surface, on each smooth surface of two of the base materials having smooth surfaces;
    a step of exposing the surfaces of the bonding films formed on the two base materials to a space having moisture to hydrophilize the surfaces of the bonding films by which moisture is adsorbed to the surface of the bonding films; and
    a step of bonding the two base materials by overlaying them with each other so that the surfaces of the bonding films in a hydrophilic state contact each other.

2. The chemical bonding method according to claim 1, which comprises a step of further heating the base materials after the bonding.

3. The chemical bonding method according to claim 2, wherein the heating is performed at a temperature of 400° C. or lower.

4. The chemical bonding method according to claim 1, wherein the overlaying of the two base materials is performed in air.

5. The chemical bonding method according to claim 1, wherein the bonding films are the oxide thin films formed by vacuum deposition.

6. The chemical bonding method according to claim 1, wherein the bonding films are formed by oxidizing at least the surface of the thin films of a metal or semiconductor formed by vacuum deposition.

7. The chemical bonding method according to claim 1, wherein the hydrophilization of the surfaces of the bonding films is performed by taking out the base materials having the bonding films from a vacuum vessel to air.

8. The chemical bonding method according to claim 1, wherein the hydrophilization of the surfaces of the bonding films is performed by introducing moisture into the vacuum vessel in which the vacuum deposition has been performed.

9. The chemical bonding method according to claim 1, wherein the bonding films are formed to have a surface roughness with an arithmetic mean height Sa of 0.5 nm or less.

10. A chemical bonding method comprising:
    a step of forming a bonding film, which is a thin film of a metal or semiconductor formed by vacuum deposition involving rapid cooling of raw material atoms on base materials, and having many defects and hydrophilicity, and oxidized at least on its surface, on one of the smooth surfaces of two of the base materials having smooth surfaces;
    a step of exposing the surface of the bonding films to a space having moisture to hydrophilize the surfaces of the bonding films by which moisture is adsorbed to the surfaces of the bonding films; and
    a step of bonding the two base materials by overlaying them with each other so that the surface of the bonding film in a hydrophilic state contacts the oxide thin film of a metal or semiconductor formed on the smooth surface of the other base material.

11. The chemical bonding method according to claim 10, which comprises a step of further heating the base materials after the bonding.

12. The chemical bonding method according to claim 11, wherein the heating is performed at a temperature of 400° C. or lower.

13. The chemical bonding method according to claim 10, wherein the overlaying of the two base materials is performed in air.

14. The chemical bonding method according to claim 10, wherein the bonding films are the oxide thin films formed by vacuum deposition.

15. The hybrid bonding method for electronic devices according to claim 10, wherein the bonding films are formed by oxidizing at least the surfaces of the thin films of a metal or semiconductor formed by vacuum deposition.

16. The chemical bonding method according to claim 10, wherein the hydrophilization of the surfaces of the bonding films is performed by taking out the base materials having the bonding films from a vacuum vessel to air.

17. The chemical bonding method according to claim 10, wherein the hydrophilization of the surfaces of the bonding films is performed by introducing moisture into the vacuum vessel in which the vacuum deposition has been performed.

18. The chemical bonding method according to claim 10, wherein the bonding films are formed to have a surface roughness with an arithmetic mean height Sa of 0.5 nm or less.

19. A chemical bonding method comprising:
a step of forming a bonding film, which is a thin film of a metal or semiconductor formed by vacuum deposition involving rapid cooling of raw material atoms on base materials, and having many defects and hydrophilicity, and oxidized at least on its surface, on one of the smooth surfaces of two of the base materials having smooth surfaces;
a step of exposing the surface of the bonding films to a space having moisture to hydrophilize the surfaces of the bonding films by which moisture is adsorbed to the surfaces of the bonding films; and
a step of bonding the two base materials by overlaying them so that the surface of the bonding film in a hydrophilic state contacts the smooth surface of the other base material, which comprises a hydrophilized or activated metal or semiconductor, or an oxide thereof.

20. The chemical bonding method according to claim 19, which comprises a step of further heating the base materials after the bonding.

21. The chemical bonding method according to claim 20, wherein the heating is performed at a temperature of 400° C. or lower.

22. The chemical bonding method according to claim 19, wherein the overlaying of the two base materials is performed in air.

23. The chemical bonding method according to claim 19, wherein the bonding films are the oxide thin films formed by vacuum deposition.

24. The hybrid bonding method for electronic devices according to claim 19, wherein the bonding films are formed by oxidizing at least the surfaces of the thin films of a metal or semiconductor formed by vacuum deposition.

25. The chemical bonding method according to claim 19, wherein the hydrophilization of the surfaces of the bonding films is performed by taking out the base materials having the bonding films from a vacuum vessel to air.

26. The chemical bonding method according to claim 19, wherein the hydrophilization of the surfaces of the bonding films is performed by introducing moisture into the vacuum vessel in which the vacuum deposition has been performed.

27. The chemical bonding method according to claim 19, wherein the bonding films are formed to have a surface roughness with an arithmetic mean height Sa of 0.5 nm or less.

28. A packaged electronic component with an electronic component sealed inside a hollow package formed by bonding a package body to a lid,
a junction between the package body and the lid comprising
an intermediate layer comprising a first thin film of a metal or semiconductor oxidized at least on its surface formed on a smooth surface of the package body and a second thin film of a metal or semiconductor oxidized at least on its surface formed on a smooth surface of the lid,
an interface between the first and second thin films of the intermediate layer being bonded by chemical bonding, and at least a part of the first thin film and the second thin film of the intermediate layer being formed by an oxide thin film with many defects, and
a hollow space of the package being sealed with a gas at atmospheric pressure.

29. The packaged electronic component according to claim 28, wherein the gas at atmospheric pressure is an inert gas.

30. A packaged electronic component with an electronic component sealed inside a hollow package formed by bonding a package body to a lid,
a junction between the package body and the lid comprising
an intermediate layer comprising a thin film of a metal or semiconductor oxidized at least on its surface formed on a smooth surface of either the package body or the lid,
an interface between the intermediate layer and a smooth surface of the other of the package body or the lid, which comprises a metal, semiconductor, or oxide thereof, being bonded by chemical bonding, and at least a part of the intermediate layer being formed by an oxide thin film with many defects, and
a hollow space in the package being sealed with a gas at atmospheric pressure.

31. The packaged electronic component according to claim 30, wherein the gas at atmospheric pressure is an inert gas.

32. A hybrid bonding method for electronic devices, comprising forming a bonding surface that is at least partially smooth and has an electrode portion and an insulating portion on each of the two electronic devices to be bonded, and bonding the two bonding surfaces by aligning the electrode portions and the insulating portions with each other,
the bonding between the two bonding surface comprising:
a step of forming a bonding film on each of the two bonding surfaces, which is a thin film of a metal or semiconductor formed by vacuum deposition and oxidized at least on its surface,
a step of exposing the surfaces of the bonding films formed on the two bonding surfaces to a space having moisture to hydrophilize the surfaces of the bonding films, and
a step of overlaying the two bonding surfaces with each other and bonding them together so that the surfaces of the bonding films in a hydrophilic state contacting each other with the electrode portions and the insulating portions of the two bonding surfaces aligned with each other, the bonding through the bonding films providing continuity between the electrode portions of the two bonding surfaces and making the insulating portions electrically insulated.

33. The hybrid bonding method for electronic devices according to claim 32, wherein the bonding films are formed by oxidizing at least the surfaces of the thin films of a metal or semiconductor formed by vacuum deposition.

34. The hybrid bonding method for electronic devices according to claim 32, wherein the bonding by overlaying the bonding surfaces is followed by a step of heating at a temperature of 300° C. or lower.

35. The hybrid bonding method for electronic devices according to claim 32, wherein a thickness of the bonding films is from 0.3 nm to 5 nm.

36. A hybrid bonding method for electronic devices, comprising forming a bonding surface that is at least partially smooth and has an electrode portion and an insulating portion on each of the two electronic devices to be bonded, and bonding the two bonding surfaces by aligning the electrode portions and the insulating portions with each other,
the bonding between the two bonding surface comprising:
a step of forming a bonding film on one of the bonding surfaces, which is a thin film of a metal or semiconductor formed by vacuum deposition and oxidized at least on its surface,
a step of exposing the surface of the bonding film to a space having moisture to hydrophilize the surface of the bonding film,
a step of bonding the two bonding surfaces by overlaying them so that the surface of the bonding film in a hydrophilic state contacts the oxide thin film of a metal or semiconductor formed on the other bonding surface with the electrode portions and the insulating portions of the two bonding surfaces aligned with each other,
the bonding through the bonding film providing continuity between the electrode portions of the two bonding surfaces and making the insulating portions electrically insulated.

37. The hybrid bonding method for electronic devices according to claim 36, wherein the bonding films are formed by oxidizing at least the surfaces of the thin films of a metal or semiconductor formed by vacuum deposition.

38. The hybrid bonding method for electronic devices according to claim 36, wherein the bonding by overlaying the bonding surfaces is followed by a step of heating at a temperature of 300° C. or lower.

39. The hybrid bonding method for electronic devices according to claim 36, wherein a thickness of the bonding films is from 0.3 nm to 5 nm.

40. A hybrid bonding method for electronic devices, comprising forming a bonding surface that is at least partially smooth and has an electrode portion and an insulating portion on each of the two electronic devices to be bonded, and bonding the two bonding surfaces by aligning the electrode portions and the insulating portions with each other,
the bonding between the two bonding surface comprising:
a step of forming a bonding film, which is a thin film of a metal or semiconductor formed by vacuum deposition and oxidized at least on its surface, on one of the bonding surfaces after forming the electrode portions and insulating portions,
a step of exposing the surface of the bonding film to a space having moisture to hydrophilize the surface of the bonding film,
a step of bonding the two bonding surfaces by overlaying them with each other so that the surface of the bonding film in a hydrophilic state contacts the other hydrophilized or activated bonding surface with the electrode portions and the insulating portions of the two bonding surfaces aligned with each other,
the bonding through the bonding film providing continuity between the electrode portions of the two bonding surfaces and making the insulating portions electrically insulated.

41. The hybrid bonding method for electronic devices according to claim 40, wherein the bonding films are formed by oxidizing at least the surfaces of the thin films of a metal or semiconductor formed by vacuum deposition.

42. The hybrid bonding method for electronic devices according to claim 40, wherein the bonding by overlaying the bonding surfaces is followed by a step of heating at a temperature of 300° C. or lower.

43. The hybrid bonding method for electronic devices according to claim 40, wherein a thickness of the bonding films is from 0.3 nm to 5 nm.

\* \* \* \* \*